US012733358B2

(12) United States Patent
Lee et al.

(10) Patent No.: US 12,733,358 B2
(45) Date of Patent: Sep. 8, 2026

(54) DISPLAY DEVICE AND METHOD OF INSPECTING ALIGNMENT OF DRIVING CIRCUIT CHIP

(71) Applicant: Samsung Display Co., Ltd., Yongin-si (KR)

(72) Inventors: Dong-Youb Lee, Yongin-si (KR); Kyung-Mok Lee, Yongin-si (KR); Heesook Yoon, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 57 days.

(21) Appl. No.: 18/310,594

(22) Filed: May 2, 2023

(65) Prior Publication Data

US 2024/0032358 A1 Jan. 25, 2024

(30) Foreign Application Priority Data

Jul. 22, 2022 (KR) ........................ 10-2022-0091125

(51) Int. Cl.

| | |
|---|---|
| ***H10K 59/131*** | (2023.01) |
| ***G06F 1/16*** | (2006.01) |
| ***G06T 7/00*** | (2017.01) |
| ***G06T 7/70*** | (2017.01) |
| ***G09F 9/30*** | (2006.01) |
| ***G09G 3/00*** | (2006.01) |
| ***G09G 3/30*** | (2006.01) |
| ***G09G 3/32*** | (2016.01) |
| ***H10K 71/70*** | (2023.01) |

(52) U.S. Cl.

CPC ......... *H10K 59/131* (2023.02); *G06T 7/0004* (2013.01); *G06T 7/70* (2017.01); *H10K 71/70* (2023.02)

(58) Field of Classification Search

None

See application file for complete search history.

(56) References Cited

U.S. PATENT DOCUMENTS

2011/0019141 A1* 1/2011 Yoon .................... G02F 1/1345 349/138
2012/0120227 A1* 5/2012 Chang .................. G02F 1/1345 348/88
2015/0103500 A1* 4/2015 Bae ........................ H05K 1/111 228/102

(Continued)

FOREIGN PATENT DOCUMENTS

KR 10-2016-0091526 8/2016
KR 20210004006 A * 1/2021 ......... H10K 59/8792
KR 10-2021-0150649 12/2021

*Primary Examiner* — Hung Q Dang

(74) *Attorney, Agent, or Firm* — CHAU & ASSOCIATES, LLC

(57) ABSTRACT

A display device includes a display panel and a driving circuit chip. The driving circuit chip includes a signal bump and an alignment bump. The display panel includes a pixel disposed in a display area, a signal pad disposed in a non-display area and corresponding to the signal bump, an alignment pad disposed in the non-display area and corresponding to the alignment bump, a reference pad that is disposed in the non-display area, is spaced apart from the alignment pad, and does not overlap the driving circuit chip in a plan view, and a signal line disposed in the display area and the non-display area and electrically connecting the pixel and the signal pad.

17 Claims, 18 Drawing Sheets

(56) References Cited

U.S. PATENT DOCUMENTS

| | | | | |
|---|---|---|---|---|
| 2015/0366049 | A1* | 12/2015 | Lee | H05K 1/111 361/767 |
| 2016/0147263 | A1* | 5/2016 | Choi | G06F 1/1616 361/679.3 |
| 2018/0040576 | A1* | 2/2018 | Kim | H10K 59/131 |
| 2019/0274216 | A1* | 9/2019 | Kubota | H05K 1/0201 |
| 2020/0191862 | A1* | 6/2020 | Abhishek | G01R 31/2853 |
| 2021/0055760 | A1* | 2/2021 | Lee | G06F 1/1641 |
| 2021/0091163 | A1* | 3/2021 | Son | H01L 27/1225 |
| 2021/0157192 | A1 | 5/2021 | Abe et al. | |
| 2021/0383730 | A1 | 12/2021 | Kim et al. | |
| 2022/0107525 | A1 | 4/2022 | Oh et al. | |

* cited by examiner

ED
WM
DP
DP-DA
DP-NDA
DD
DIC
FCB
DP
PSA
LM
EM
PSM
HM1
HM
HM2
EM
PSM
DP
PSA
LM
DIC
FCB
DM
DR3
DR2
DR1

DP
LD
CE
EML
AE
OP
60
50
40
30
20
10
BFL
BRL
T1
T2
PC
PX
LD
DMP
CH
PD
DL
AA2
UE-OP
UE
G1
D1
A1
S1
AC1
T1
CH11
CH10
AA1
CNE-D1
G2
D2
A2
S2
AC2
T2
140
PDL
DL
CL5
CH22
CL4
CH21
CL3
CNE-G3
CL2
CL1
CH20
ACP
110
130
120

DIC
ALB
D-I
D-IE
SALB
B-OP
B-IP
D-BP
B-OP
VL
SMB
AIB
ACA1
B-IP
B-1
B-2
B-3
B-4
B-5
B-10
DR1
DR2
DR3
CDR1
CDR2

120
110
PSA
LM
II'
DSP
AID
ALP
ALB
D-I
DIC
SMB
SMP
B-OP
PD1
II
DR1
DR2
DR3

FIG. 8E

ACA1, ACA2
AIB
D-B
CF1
AIP
120
110
PSA
LM
AID
DR2
DR1
DR3

FIG. 8G

SALB SALP
CF1
120
110
PSA
LM
AID
DR2
DR1
DR3

DISPLAY DEVICE AND METHOD OF INSPECTING ALIGNMENT OF DRIVING CIRCUIT CHIP

CROSS-REFERENCE TO RELATED APPLICATIONS(S)

This application claims priority to and benefits of Korean Patent Application No. 10-2022-0091125 under 35 U.S.C. § 119, filed on Jul. 22, 2022, in the Korean Intellectual Property Office (KIPO), the entire contents of which are incorporated herein by reference.

BACKGROUND

1. Technical Field

The disclosure relates to a display device and a method of inspecting an alignment of a driving circuit chip mounted on the display device.

2. Description of the Related Art

A display device includes a display area that is activated in response to electrical signals. The display device senses an input applied thereto from the outside through the display area and displays images to provide a user with information through the display area. In recent years, as the display devices of a variety of shapes are being developed, the display areas are designed in various shapes.

The display device includes a display panel and a circuit board. The display panel is connected to a main board via the circuit board. A driving circuit chip is mounted on the display panel.

SUMMARY

The disclosure provides a display device capable of improving a quality of alignment inspection of electronic components.

The disclosure provides a method of inspecting an alignment of a driving circuit chip with improved alignment inspection quality.

Embodiments of the disclosure provide a display device that may include a display panel including a display area through which an image is displayed and a non-display area defined adjacent to the display area, and a driving circuit chip disposed in the non-display area and electrically connected to the display panel. The driving circuit chip may include a signal bump and an alignment bump. The display panel may include a pixel disposed in the display area, a signal pad disposed in the non-display area and corresponding to the signal bump, an alignment pad disposed in the non-display area and corresponding to the alignment bump, a reference pad that is disposed in the non-display area, is spaced apart from the alignment pad, and does not overlap the driving circuit chip in a plan view, and a signal line disposed in the display area and the non-display area and electrically connecting the pixel and the signal pad.

The alignment pad, the signal pad, and the reference pad may include a same material.

The alignment pad, the signal pad, and the reference pad may be disposed on a same insulating layer.

The pixel may include a light emitting element and a transistor electrically connected to the light emitting element and the signal line, and a portion of the signal line a gate of the transistor may include a same material.

At least one insulating layer may be disposed between the portion of the signal line and the signal pad, and the signal pad may be electrically connected to the portion of the signal line via a contact hole defined through the at least one insulating layer.

The display device may further include a lower member disposed under the display panel, and an adhesive layer attaching the display panel to the lower member. The adhesive layer may overlap the driving circuit chip in a plan view.

A thickness of the adhesive layer may be in a range of about 25 micrometers to about 30 micrometers in a thickness direction of the display panel.

Each of the alignment pad and the reference pad may be electrically isolated.

The display area may be substantially parallel to a plane defined by a first direction and a second direction perpendicular to the first direction, the non-display area may extend from the display area in the second direction, and a center of the reference pad may be aligned with a center of the alignment pad in the first direction.

The driving circuit chip may further include an alignment inspection bump, and the display panel may further include an alignment inspection pad that is disposed in the non-display area, overlaps the driving circuit chip in a plan view, and does not overlap the alignment inspection bump in a plan view.

The alignment inspection bump may be disposed closer to the signal bump than the alignment bump, an area of the alignment inspection bump may be less than an area of the signal bump in a plan view, and an area of the alignment inspection pad may be less than an area of the signal pad in a plan view.

The signal bump may extend in a first diagonal direction, each of the alignment inspection bump and the alignment inspection pad may extend substantially parallel to the signal bump in a plan view, and the alignment inspection bump and the alignment inspection pad may be substantially aligned with each other in the first diagonal direction.

Each of the alignment inspection bump and the alignment inspection pad may be electrically isolated.

The display device may be foldable.

The signal bump and the signal pad may be electrically connected to each other by an anisotropic conductive adhesive layer.

Embodiments of the disclosure provide a display device that may include a display panel including a display area in which pixels are disposed and a non-display area defined adjacent to the display area, and an electronic component disposed in the non-display area and electrically connected to the display panel.

The electronic component may include a signal terminal and an alignment mark. The display panel may include a signal pad disposed in the non-display area and corresponding to the signal terminal, an alignment pad disposed in the non-display area and corresponding to the alignment mark, and a reference pad that is disposed in the non-display area, is spaced apart from the alignment pad, and does not overlap the electronic component in a plan view.

The electronic component may include a driving circuit chip or a circuit board.

Embodiments of the disclosure provide a method of inspecting an alignment of a driving circuit chip mounted on a display panel. The method may include detecting a position of an alignment pad of the display panel using an inspection device, determining that the position of the alignment pad of the display panel is not detected, detecting a position of a reference pad of the display panel using the inspection device, detecting a position of an alignment inspection pad of the display panel based on the position of the reference pad, and detecting an alignment state between the alignment inspection pad of the display panel and an alignment inspection bump of the driving circuit chip.

The driving circuit chip may further include a signal bump, and an alignment bump corresponding to the alignment pad. The display panel may further include a signal pad corresponding to the signal bump.

The signal bump may extend in a first diagonal direction, each of the alignment inspection bump and the alignment inspection pad may extend substantially parallel to the signal bump in a plan view, and the alignment inspection bump and the alignment inspection pad may be substantially aligned with each other in the first diagonal direction.

According to the above, the alignment of the display panel and the electronic component may be inspected using the reference pad that does not overlap the electronic component even though the inspection device does not recognize the position of the alignment pad.

Since the reference pad does not overlap the electronic component in a plan view, the process of bonding the electronic component and the display panel may be free from noises generated in the area overlapping the electronic component.

BRIEF DESCRIPTION OF THE DRAWINGS

The above and other advantages of the disclosure will become readily apparent by reference to the following detailed description in conjunction with the accompanying drawings wherein:

FIGS. 8A to 8G illustrate a method of inspecting an alignment of a driving circuit chip according to an embodiment of the disclosure.

DETAILED DESCRIPTION OF THE EMBODIMENTS

Figure 1A:
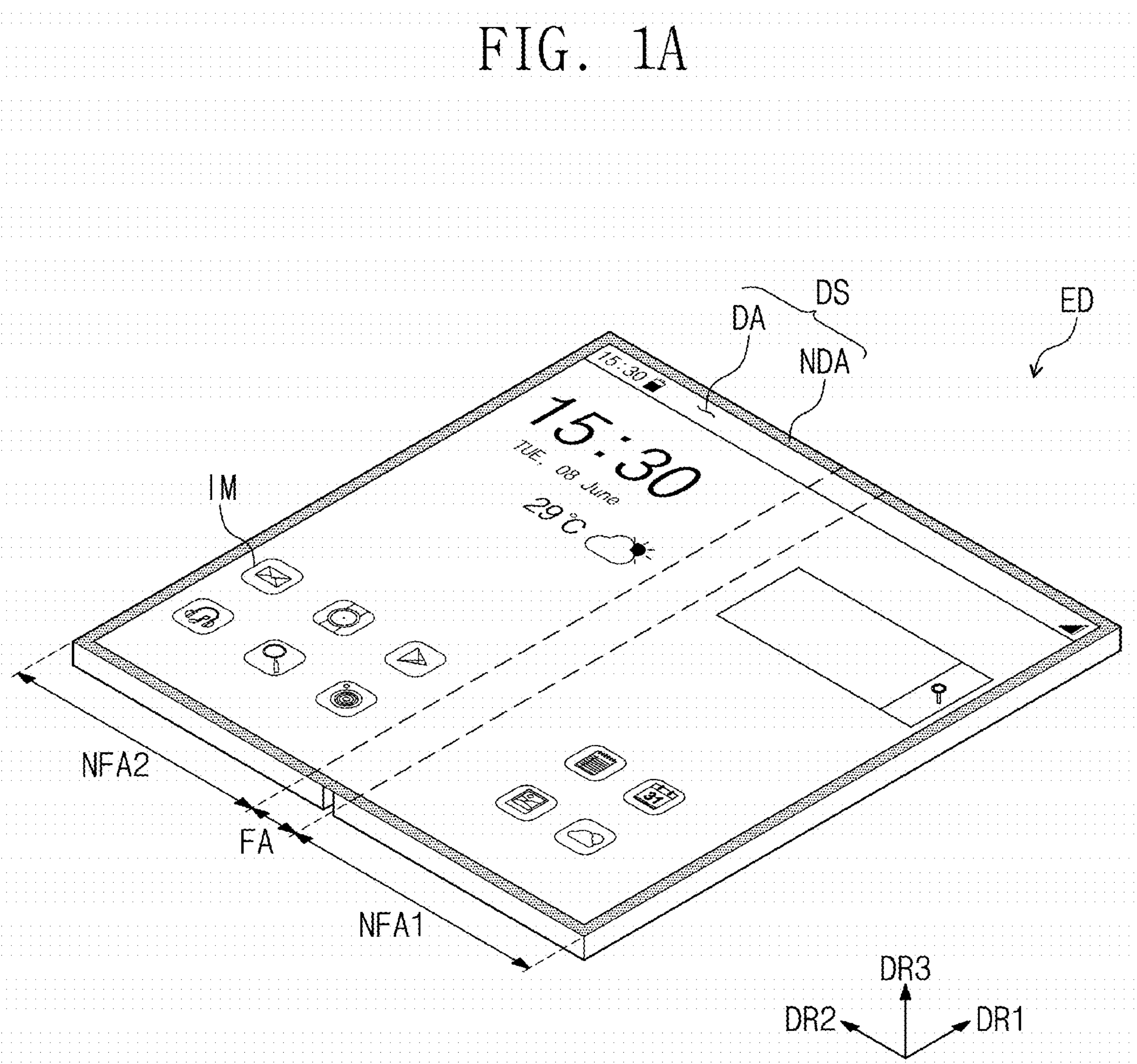
FIGS. 1A and 1B are perspective views of an electronic device according to an embodiment of the disclosure.

In the disclosure, when an element, such as a layer, is referred to as being "on", "connected to", or "coupled to" another element or layer, it may be directly on, connected to, or coupled to the other element or layer or intervening elements or layers may be present. When, however, an element or layer is referred to as being "directly on", "directly connected to", or "directly coupled to" another element or layer, there are no intervening elements or layers present. To this end, the term "connected" may refer to physical, electrical, and/or fluid connection, with or without intervening elements.

Like numerals refer to like elements throughout. In the drawings, the thickness, ratio, and dimension of components are exaggerated for effective description of the technical content. In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

It will be understood that, although the terms first, second, etc. may be used herein to describe various elements, these elements should not be limited by these terms. These terms are only used to distinguish one element from another element. Thus, a first element discussed below could be termed a second element without departing from the teachings of the disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another elements or features as shown in the figures.

It will be further understood that the terms "include" and/or "including", when used in this specification, specify the presence of stated features, integers, steps, operations, elements, and/or components, but do not preclude the presence or addition of one or more other features, integers, steps, operations, elements, components, and/or groups thereof.

The terms "about" or "approximately" as used herein is inclusive of the stated value and means within an acceptable range of deviation for the particular value as determined by one of ordinary skill in the art, considering the measurement in question and the error associated with measurement of the particular quantity (for example, the limitations of the measurement system). For example, "about" may mean within one or more standard deviations, or within ±30%, 20%, 10%, 5% of the stated value.

Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the disclosure will be described with reference to accompanying drawings.

Figure 1B:
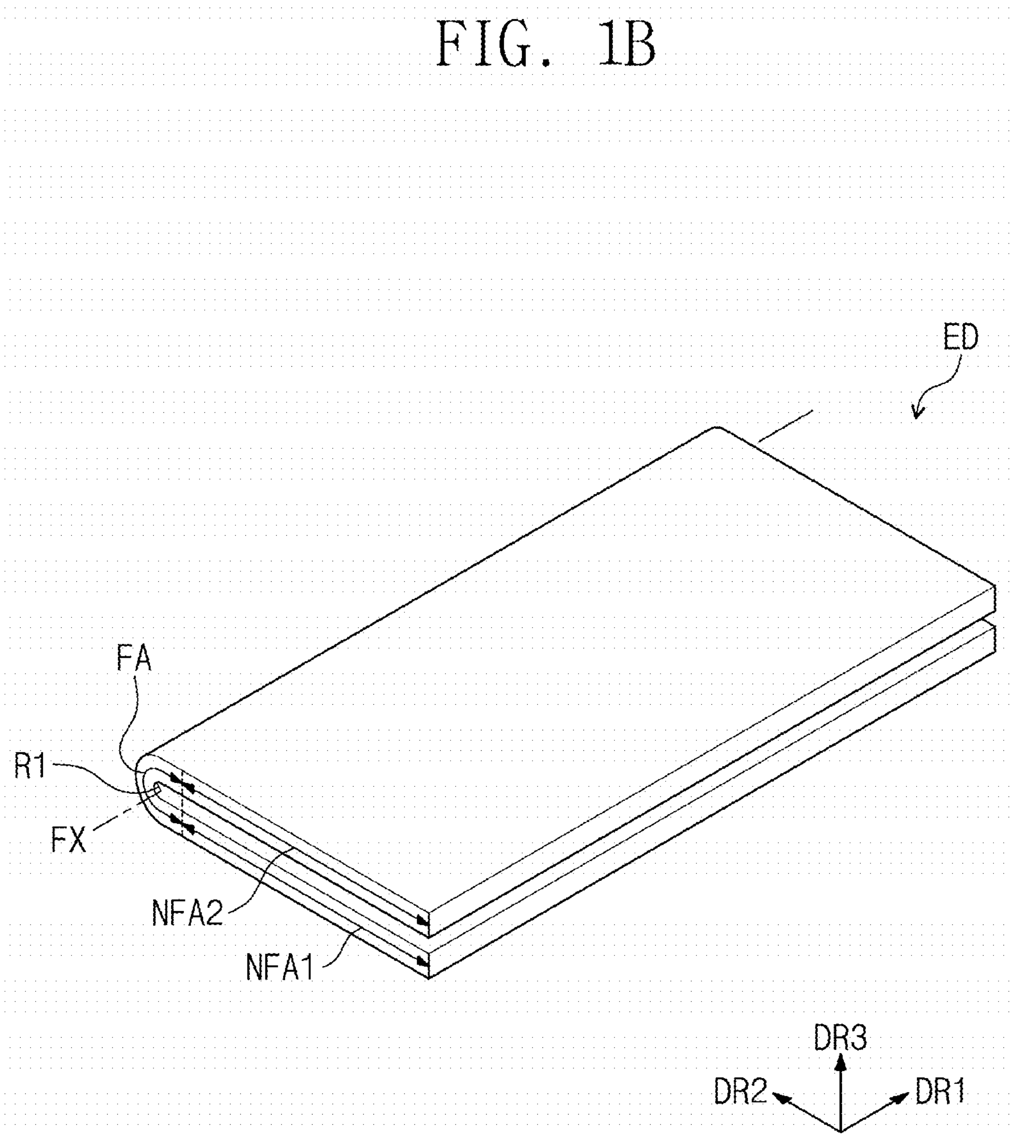

FIGS. 1A and 1B are perspective views of an electronic device ED according to an embodiment of the disclosure. FIG. 1A shows an unfolded state of the electronic device ED, and FIG. 1B shows a folded state of the electronic device ED.

Referring to FIGS. 1A and 1B, the electronic device ED may include a display surface DS substantially parallel to a plane defined by a first direction DR1 and a second direction DR2 crossing the first direction DR1 in the unfolded state. The electronic device ED may provide an image IM to a user through the display surface DS.

The display surface DS may include a display area DA and a non-display area NDA disposed adjacent to the display area DA. The display area DA may display an image IM, and the non-display area NDA may not display an image IM. The non-display area NDA may surround the display area DA, however, the disclosure is not limited thereto or thereby, and the shape of the display area DA and the shape of the non-display area NDA may be changed.

Hereinafter, a direction substantially perpendicular to the plane defined by the first direction DR1 and the second direction DR2 may be referred to as a third direction DR3. Front and rear surfaces of each member of the electronic device ED may be distinguished from each other with respect to the third direction DR3. In the disclosure, the expression "when viewed in a plane" and "in a plan view" may mean a state of being viewed in the third direction DR3. Hereinafter, the first, second, and third directions DR1, DR2, and DR3 may mean directions respectively indicated by first, second, and third directional axes.

In the disclosure, unless otherwise specified herein, each of the first direction DR1, the second direction DR2, and the third direction DR3 may include opposite directions thereto. For instance, the first direction DR1 may be a horizontal axis or an X-axis, and the second direction DR2 may be a vertical axis or a Y-axis. For example, the expression "a conductive pattern extends in the first direction DR1" may mean that the extended shape of the conductive pattern is substantially parallel to the horizontal axis or the X axis.

The electronic device ED may include a folding area FA and multiple non-folding areas NFA1 and NFA2. The non-folding areas NFA1 and NFA2 may include a first non-folding area NFA1 and a second non-folding area NFA2. The folding area FA may be disposed between the first non-folding area NFA1 and the second non-folding area NFA2 in the second direction DR2.

As shown in FIG. 1B, the folding area FA may be folded with respect to a folding axis FX substantially parallel to the first direction DR1. The folding area FA may have a curvature (predetermined or selectable) and a radius of curvature R1. The electronic device ED may be inwardly folded (inner-folding) such that the first non-folding area NFA1 may face the second non-folding area NFA2 and the display surface DS may not be exposed to the outside. In the folded state of the electronic device ED, the display surface DS of FIG. 1A may include two display areas substantially parallel to the plane defined by the first direction DR1 and the second direction DR2.

According to an embodiment, the electronic device ED may be outwardly folded (outer-folding) such that the display surface DS may be exposed to the outside. According to an embodiment, the electronic device ED may be provided to carry out the inner-folding operation and an unfolding operation or to carry out the outer-folding operation and the unfolding operation. According to an embodiment, the electronic device ED may be provided to carry out any one of the unfolding operation, for example, the inner-folding operation, and the outer-folding operation.

Figure 2:
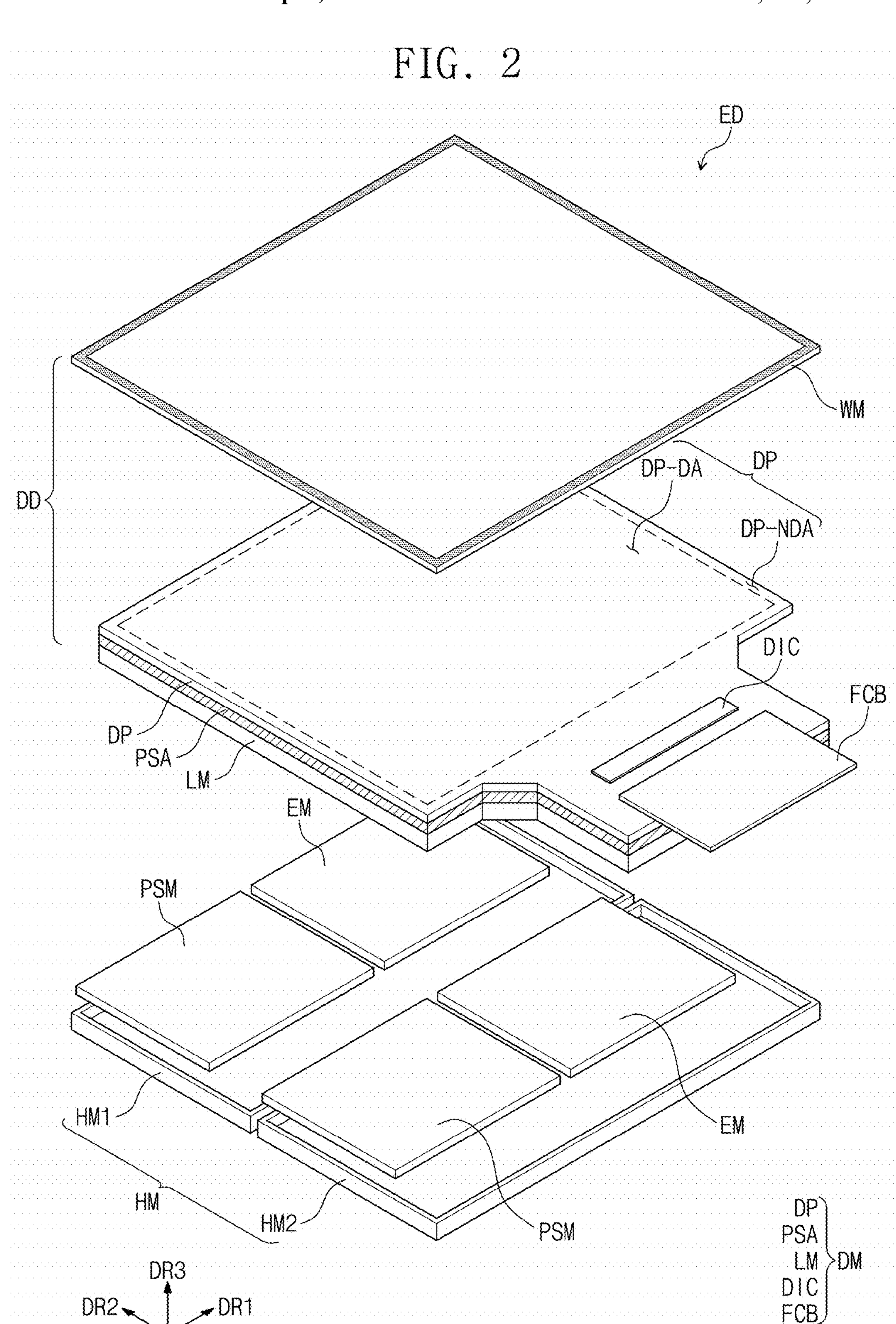
FIG. 2 is an exploded perspective view of an electronic device according to an embodiment of the disclosure.
Figure 3:
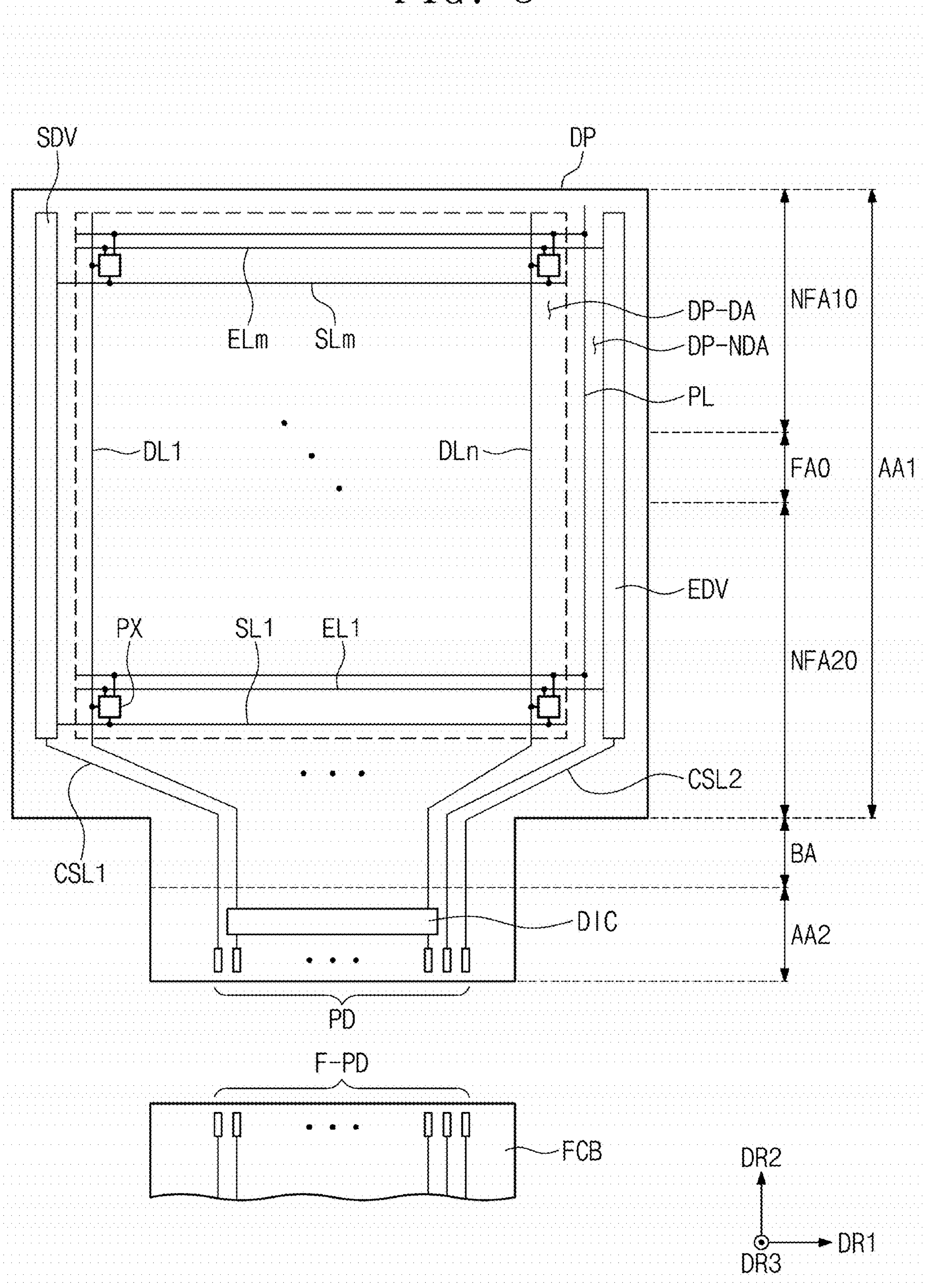
FIG. 3 is a plan view of a display panel according to an embodiment of the disclosure.

FIG. 2 is an exploded perspective view of the electronic device ED according to an embodiment of the disclosure. FIG. 3 is a plan view showing a display panel DP according to an embodiment of the disclosure.

Referring to FIGS. 2 and 3, the electronic device ED may include a display device DD, an electronic module EM, a power source module PSM, and a housing HM. The electronic device ED may further include a mechanical structure (not illustrated in FIGS. 2 and 3) to control a folding operation of the display device DD.

The display device DD may generate an image and may sense an external input. The display device DD may include a window WM and a display module DM. The window WM may provide a front surface of the electronic device ED. The window WM may include a base layer and a bezel pattern. The base layer may include a glass substrate or a synthetic resin film.

The display module DM may include at least one display panel DP. FIG. 2 shows the display panel DP, a lower member LM, and an adhesive layer PSA that attaches the display panel DP to the lower member LM among components of the display module DM, which are stacked each other. However, the display module DM may also include multiple components disposed above the display panel DP. The lower member LM may have a stack structure in which various members are stacked each other. Detailed descriptions on the stack structure of the display module DM and the lower member LM will be described below.

The display panel DP is not particularly limited, and the display panel DP may be a light emitting type display panel, for example, an organic light emitting display panel or an inorganic light emitting display panel. The display panel DP may include a display area DP-DA and a non-display area DP-NDA, which respectively correspond to the display area DA (refer to FIG. 1A) and the non-display area NDA (refer to FIG. 1A) of the electronic device ED. In the disclosure, the expression "an area/portion corresponds to another area/portion" means that "an area/portion overlaps another area/portion", however, the "areas and/or portions" should not be limited to having the same size as each other.

Referring to FIG. 2, the display module DM may include a driving circuit chip DIC disposed in the non-display area DP-NDA of the display panel DP. The display module DM may also include a circuit board FCB disposed in the non-display area DP-NDA of the display panel DP. In the embodiment, the circuit board FCB may be a flexible circuit board. Hereinafter, the circuit board FCB will be referred to as a flexible circuit board and will be assigned with the same reference numeral as the circuit board FCB, however, the disclosure is not limited thereto or thereby. The flexible circuit board FCB may electrically connect the display panel DP and a main circuit board (not shown). The main circuit board may be an electronic component constituting the electronic module EM.

The driving circuit chip DIC may include driving elements, e.g., a data driving circuit, to drive pixels of the display panel DP. FIG. 2 shows a structure in which the driving circuit chip DIC is mounted on the display panel DP, however, the disclosure is not limited thereto or thereby. For example, the driving circuit chip DIC may be mounted on the flexible circuit board FCB. In the embodiment, the driving circuit chip DIC mounted (e.g., directly mounted) on the display panel DP and the flexible circuit board FCB may be referred to as electronic components. Hereinafter, a bonding structure of the display panel DP and the driving circuit chip DIC may be applied to other electronic components such as the flexible circuit board FCB other than the driving circuit chip DIC.

The display module DM may include an input sensor IS (refer to FIG. 4A) disposed on the display panel DP. The lower member LM may include a support member, a digitizer, and an adhesive layer attaching the support member to the digitizer. The input sensor IS may sense a user input. An electromagnetic induction type digitizer may sense an input generated by a stylus pen.

The electronic module EM may include a control module, a wireless communication module, an image input module, an audio input module, an audio output module, a memory, and an external interface module. The control module may control an overall operation of the electronic device ED. For example, the control module may activate or deactivate the display device DD in response to the user input. The control module may include at least one microprocessor. The electronic module EM may include a main circuit board, and the modules may be mounted on the main circuit board or may be electrically connected to the main circuit board via a flexible circuit board. The electronic module EM may be electrically connected to the power source module PSM.

Referring to FIG. 2, the electronic module EM may be disposed in each of a first housing HM1 and a second housing HM2, and the power source module PSM may be disposed in each of the first housing HM1 and the second housing HM2. The electronic module EM disposed in the first housing HM1 and the electronic module EM disposed in the second housing HM2 may be electrically connected to each other via a flexible circuit board.

The housing HM shown in FIG. 2 may be coupled to the display device DD, for example, to the window WM to accommodate the above-mentioned modules. The housing HM may include the first and second housings HM1 and HM2 separated from each other, however, the disclosure is not limited thereto or thereby. The electronic device ED may further include a hinge structure to connect the first and second housings HM1 and HM2 to each other.

Referring to FIG. 3, the display area DP-DA and the non-display area DP-NDA may be distinguished from each other by the presence or absence of a pixel PX. The pixel PX may be disposed in the display area DP-DA. A scan driver SDV, a data driver, and an emission driver EDV may be disposed in the non-display area DP-NDA. The data driver may be a circuit provided in the driving circuit chip DIC shown in FIG. 3.

The display panel DP may include a first area AA1, a second area AA2, and a bending area BA, which are distinguished from each other in the second direction DR2. The second area AA2 and the bending area BA may be areas of the non-display area DP-NDA. The bending area BA may be defined between the first area AA1 and the second area AA2. The bending area BA and the second area AA2 may substantially correspond to the non-display area DP-NDA.

The first area AA1 may generally correspond to the display surface DS of FIG. 1A. The first area AA1 may include a first non-folding area NFA10, a second non-folding area NFA20, and a folding area FAO. The first non-folding area NFA10, the second non-folding area NFA20, and the folding area FAO may respectively correspond to the first non-folding area NFA1, the second non-folding area NFA2, and the folding area FA of FIGS. 1A and 1B.

A length in the first direction DR1 of the bending area BA and the second area AA2 may be less than a length in the first direction DR1 of the first area AA1. An area having a relatively short length in a bending axis direction may be more readily bent.

The display panel DP may include multiple pixels PX, multiple scan lines SL1 to SLm, multiple data lines DL1 to DLn, multiple emission lines EL1 to ELm, first and second control lines CSL1 and CSL2, a power line PL, and multiple pads PD. In the embodiment, each of "m" and "n" may be a natural number. The pixels PX may be connected to the scan lines SL1 to SLm, the data lines DL1 to DLn, and the emission lines EU to ELm.

The scan lines SL1 to SLm may extend in the first direction DR1 and may be connected to the scan driver SDV. The data lines DL1 to DLn may extend in the second direction DR2 and may be connected to the driving circuit chip DIC via the bending area BA. The emission lines EL1 to ELm may extend in the first direction DR1 and may be connected to the emission driver EDV.

The power line PL may include a portion extending in the first direction DR1 and a portion extending in the second direction DR2. The portion extending in the first direction DR1 and the portion extending in the second direction DR2 may be disposed on different layers from each other. The portion of the power line PL, which extends in the second direction DR2, may extend to the second area AA2 via the bending area BA. The power line PL may provide a high power voltage to the pixels PX.

The first control line CSL1 may be connected to the scan driver SDV and may extend to a lower end of the second area AA2 via the bending area BA. The second control line CSL2 may be connected to the emission driver EDV and may extend to the lower end of the second area AA2 via the bending area BA.

In a plan view, the pads PD may be disposed adjacent to the lower end of the second area AA2. The pads PD may be connected to ends of the power line PL, the first control line CSL1, and the second control line CSL2. Signal pads F-PD of the flexible circuit board FCB may be electrically connected to the pads PD of the display panel DP through an anisotropic conductive adhesive layer.

Although it is not illustrated due to the presence of the driving circuit chip DIC, additional pads PD connected to ends of the data lines DL to DLn may be disposed in the second area AA2. These pads PD may be connected to output bumps of the driving circuit chip DIC. Pads PD connected to input bumps of the driving circuit chip DIC may be also disposed in the second area AA2. This will be described in detail below.

Figure 4A:
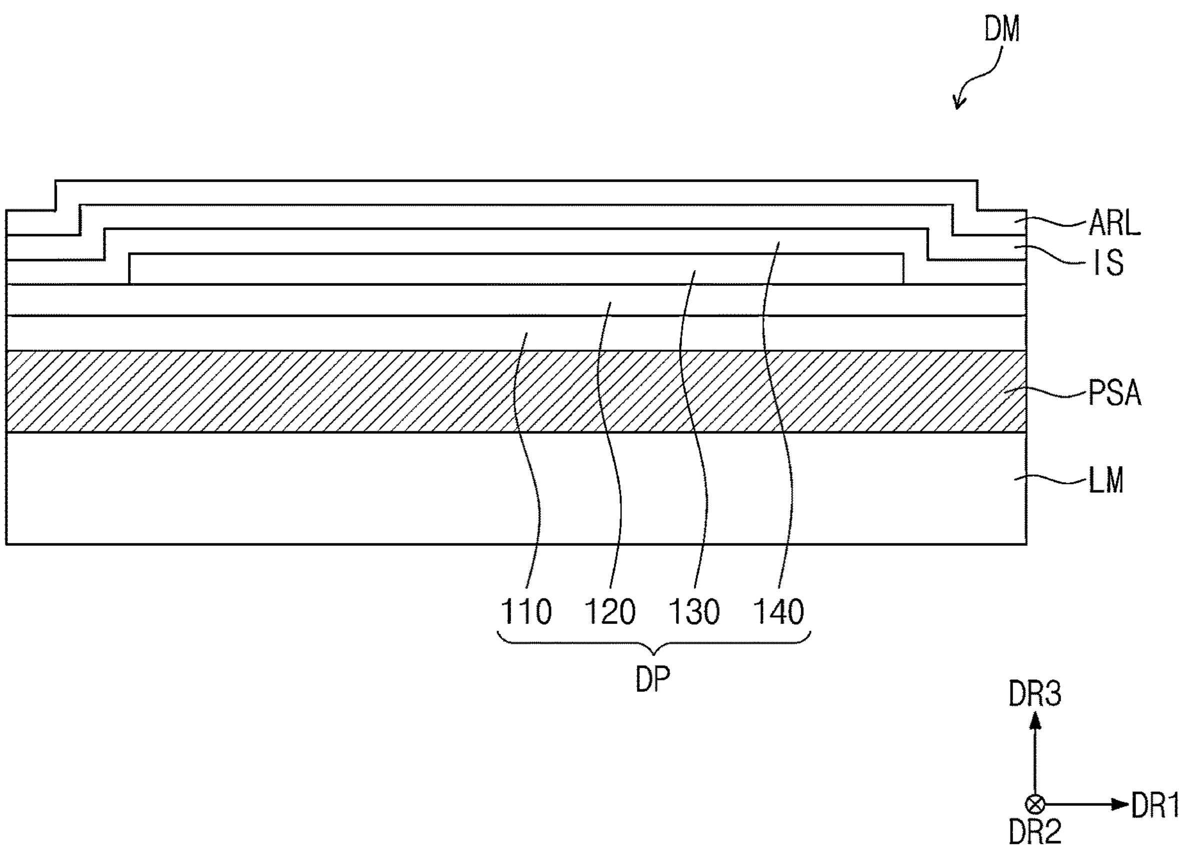
FIG. 4A is a schematic cross-sectional view of a display module according to an embodiment of the disclosure.

FIG. 4A is a schematic cross-sectional view of the display module DM according to an embodiment of the disclosure. In FIG. 4A, the adhesive layer PSA and the lower member LM, which are disposed under the display module DM, are further shown.

Referring to FIG. 4A, the display module DM may include the display panel DP, the input sensor IS, and an anti-reflective layer ARL. The display panel DP may include a base layer 110, a circuit layer 120, a light emitting element layer 130, and an encapsulation layer 140.

The base layer 110 may provide a base surface on which the circuit layer 120 is disposed. The base layer 110 may be a flexible substrate that is bendable, foldable, or rollable. The base layer 110 may be a glass substrate, a metal substrate, or a polymer substrate, however, the disclosure is not limited thereto or thereby. According to an embodiment, the base layer 110 may be an inorganic layer, an organic layer, or a composite material layer.

The base layer 110 may have a multi-layer structure. For instance, the base layer 110 may include a first synthetic resin layer, an inorganic layer having a single-layer or multi-layer structure, and a second synthetic resin layer disposed on the inorganic layer having a single-layer or multi-layer structure. Each of the first and second synthetic resin layers may include a polyimide-based resin, however, the disclosure is not particularly limited.

The circuit layer 120 may be disposed on the base layer 110. The circuit layer 120 may include an insulating layer, a semiconductor pattern, a conductive pattern, and a signal line.

The light emitting element layer 130 may be disposed on the circuit layer 120. The light emitting element layer 130 may include a light emitting element. For example, the light emitting element may include an organic light emitting material, an inorganic light emitting material, an organic-inorganic light emitting material, a quantum dot, a quantum rod, a micro-LED, or a nano-LED.

The encapsulation layer 140 may be disposed on the light emitting element layer 130. The encapsulation layer 140 may protect the light emitting element layer 130 from moisture, oxygen, and a foreign substance such as dust particles. The encapsulation layer 140 may include at least one inorganic layer. The encapsulation layer 140 may have a stack structure in which an inorganic layer, an organic layer, and an inorganic layer are sequentially stacked.

The input sensor IS may be disposed directly on the display panel DP. The input sensor IS may be formed with the display panel DP through successive processes. In the disclosure, the expression "the input sensor IS is disposed directly on the display panel DP" means that no intervening elements are present between the input sensor IS and the display panel DP. For example, a separate adhesive member might not be disposed between the input sensor IS and the display panel DP.

The input sensor IS may include at least one conductive layer and at least one insulating layer. The conductive layer may include multiple conductive patterns, and the conductive patterns may be disposed in an arrangement (predetermined or selectable) to form a sensing electrode. The input sensor IS may include a first group of sensing electrodes and a second group of sensing electrodes insulated from the first group of sensing electrodes and intersecting the first group of sensing electrodes.

The anti-reflective layer ARL may be disposed directly on the input sensor IS. The anti-reflective layer ARL may reduce a reflectance of an external light incident to the display device DD from the outside. The anti-reflective layer ARL may include color filters. The color filters may be disposed in an arrangement (predetermined or selectable). For example, the color filters may be arranged according to colors of lights emitted from the pixels included in the display panel DP. The anti-reflective layer ARL may include a black matrix adjacent to the color filters.

According to an embodiment, positions of the input sensor IS and the anti-reflective layer ARL may be changed with each other. According to an embodiment, the anti-reflective layer ARL may be replaced with a polarizing film. The polarizing film may be coupled with the input sensor IS using an adhesive layer.

Figure 4B:
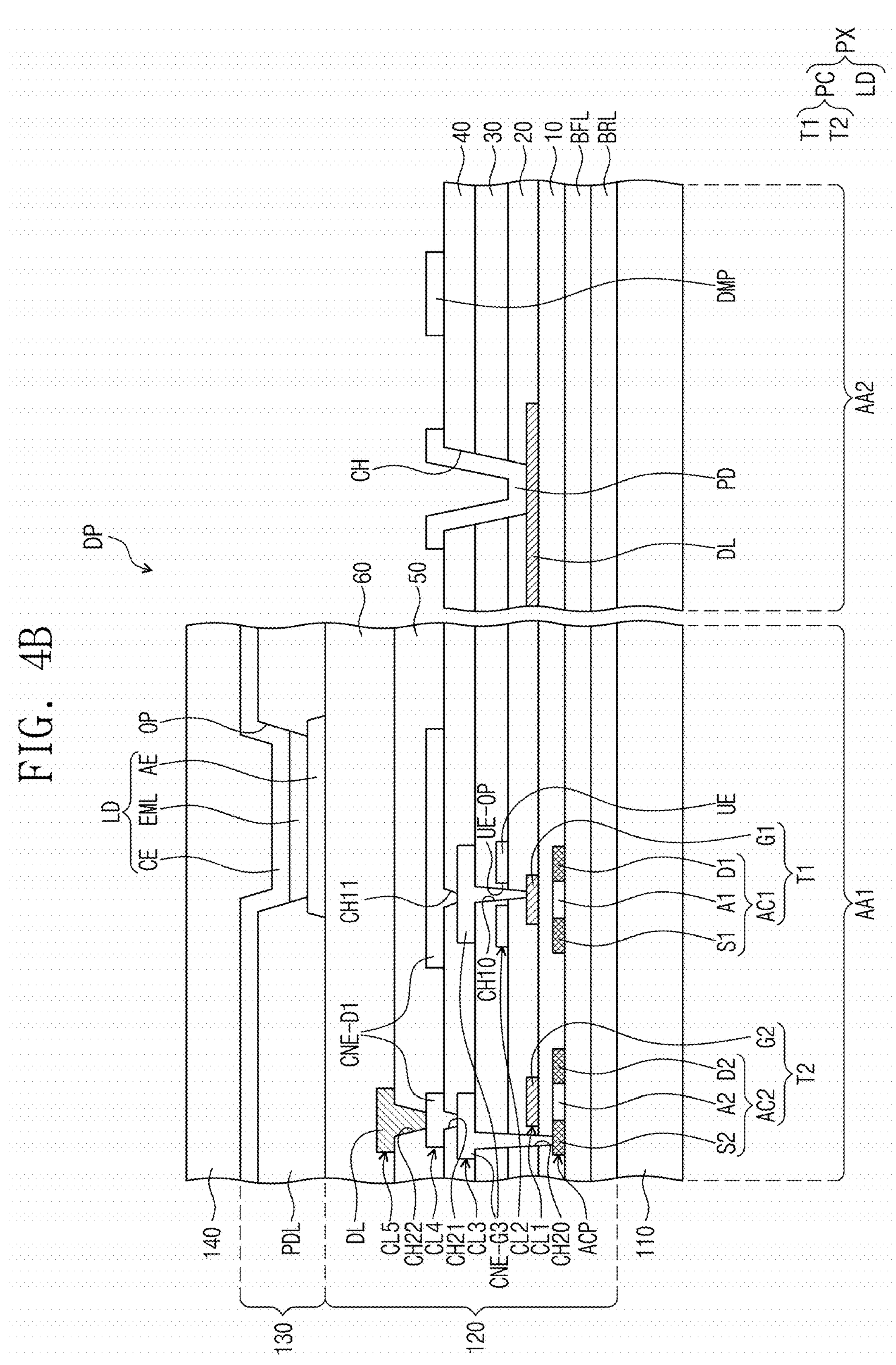
FIG. 4B is a schematic cross-sectional view of a display panel according to an embodiment of the disclosure.

FIG. 4B is a schematic cross-sectional view of a display panel according to an embodiment of the disclosure. FIG. 4B schematically shows a cross-section of the pixel PX disposed in the first area AA1 and a cross-section of the pad PD disposed in the second area AA2. The pixel PX may include a light emitting element LD and a pixel circuit PC electrically connected to the light emitting element LD. FIG. 4B shows a first transistor T1 and a second transistor T2 of the pixel circuit PC as an embodiment.

Multiple insulating layers may be disposed on an upper surface of the base layer 110. The insulating layers may include a barrier layer BRL and a buffer layer BFL. The barrier layer BRL may prevent a foreign substance from entering from the outside. The barrier layer BRL may include a silicon oxide layer and a silicon nitride layer. Each of the silicon oxide layer and the silicon nitride layer may be provided in plural, and the silicon oxide layers and the silicon nitride layers may be alternately stacked with each other.

The buffer layer BFL may improve an adhesion between the base layer 110 and the semiconductor pattern and/or the conductive pattern. The buffer layer BFL may include a silicon oxide layer and a silicon nitride layer. The silicon oxide layer and the silicon nitride layer may be alternately stacked with each other.

A semiconductor pattern ACP may be disposed on the buffer layer BFL. The semiconductor pattern ACP may include an amorphous or crystalline silicon semiconductor or a metal oxide semiconductor. As shown in FIG. 4B, the semiconductor pattern ACP may include a first semiconductor area AC1 and a second semiconductor area AC2. The first semiconductor area AC1 may include a source area S1, a channel area A1, and a drain area D1 of the first transistor T1, and the second semiconductor area AC2 may include a source area S2, a channel area A2, and a drain area D2 of the second transistor T2. According to an embodiment, the first and second transistors T1 and T2 may include different semiconductors. The first semiconductor area AC1 and the second semiconductor area AC2 may include different materials and may be disposed on different layers.

A first insulating layer 10 may be disposed on the buffer layer BFL. The first insulating layer 10 may cover the semiconductor pattern ACP. The first insulating layer 10 may be an inorganic layer, however, the disclosure is not particularly limited. A first conductive layer CL1 may be disposed on the first insulating layer 10. The first conductive layer CL1 may include multiple conductive patterns. The first conductive layer CL1 may include a gate G1 of the first transistor T1 and a gate G2 of the second transistor T2. The first conductive layer CL1 may include molybdenum (Mo), an alloy including molybdenum (Mo), titanium (Ti), or an alloy including titanium (Ti), which has a good heat resistance, but the disclosure is not limited thereto or thereby. The first conductive layer CL1 may have a single-layer or multi-layer structure.

A second insulating layer 20 may be disposed on the first insulating layer 10 to cover the first conductive layer CL1. The second insulating layer 20 may be an inorganic layer, but the disclosure is not limited thereto or thereby. A second conductive layer CL2 may be disposed on the second insulating layer 20. The second conductive layer CL2 may include multiple conductive patterns. The second conductive layer CL2 may include an upper electrode UE. The upper electrode UE may overlap the gate G1 of the first transistor T1 in a plan view and may be provided with an opening UE-OP defined therethrough. The upper electrode UE and the gate G1 of the first transistor T1 overlapping the upper electrode UE may constitute a capacitor.

A third insulating layer 30 may be disposed on the second insulating layer 20 to cover the second conductive layer CL2. The third insulating layer 30 may be an inorganic layer, but the disclosure is not limited thereto or thereby. A third conductive layer CL3 may be disposed on the third insulating layer 30. The third conductive layer CL3 may include multiple conductive patterns. The third conductive layer CL3 may include a connection electrode CNE-G3. One of the connection electrodes CNE-G3 may be connected to the gate G1 of the first transistor T1 via a contact hole CH10 defined through the second insulating layer 20 and the third insulating layer 30. The contact hole CH10 may pass through the opening UE-OP. Another connection electrode CNE-G3 may be connected to the source area S2 of the second transistor T2 via a contact hole CH20 defined through the first insulating layer 10, the second insulating layer 20, and the third insulating layer 30. The third conductive layer CL3 may include multiple connection electrodes CNE-G3.

A fourth insulating layer 40 may be disposed on the third insulating layer 30 to cover the third conductive layer CL3. The fourth insulating layer 40 may be an inorganic layer, but the disclosure is not limited thereto or thereby. A fourth conductive layer CL4 may be disposed on the fourth insulating layer 40. The fourth conductive layer CL4 may include multiple conductive patterns. The fourth conductive layer CL4 may include connection electrodes CNE-D1. The connection electrodes CNE-D1 may be connected to corresponding connection electrodes CNE-G3, respectively, via contact holes CH11 and CH21 defined through the fourth insulating layer 40.

A fifth insulating layer 50 may be disposed on the fourth insulating layer 40 to cover the fourth conductive layer CL4. The fifth insulating layer 50 may be an organic layer, but the disclosure is not limited thereto or thereby. A fifth conductive layer CL5 may be disposed on the fifth insulating layer 50. The fifth conductive layer CL5 may include multiple conductive patterns. The fifth conductive layer CL5 may include the data line DL. The data line DL may be connected to a corresponding connection electrode CNE-D1 via a contact hole CH22 defined through the fifth insulating layer 50. The data line DL shown in FIG. 4B may be one of the data lines DL1 to DLn shown in FIG. 3.

A sixth insulating layer 60 may be disposed on the fifth insulating layer 50 to cover the fifth conductive layer CL5. The sixth insulating layer 60 may be an organic layer, but the disclosure is not limited thereto or thereby. The light emitting element LD may be disposed on the sixth insulating layer 60. A first electrode AE of the light emitting element LD may be disposed on the sixth insulating layer 60. The first electrode AE may be an anode. A pixel definition layer PDL may be disposed on the sixth insulating layer 60.

The pixel definition layer PDL may be provided with an opening OP defined therethrough to expose at least a portion of the first electrode AE. The opening OP of the pixel definition layer PDL may define a light emitting area. A light emitting layer EML may be disposed on the first electrode AE. In the embodiment, a patterned light emitting layer EML is shown as an embodiment, however, the light emitting layer EML may be commonly disposed over the pixels PX (refer to FIG. 3). The light emitting layer EML that is commonly disposed may generate a white light or a blue light. The light emitting layer EML may have a multi-layer structure.

A hole transport layer may be further disposed between the first electrode AE and the light emitting layer EML. A hole injection layer may be further disposed between the hole transport layer and the first electrode AE. The hole transport layer or the hole injection layer may be commonly disposed over the pixels PX (refer to FIG. 3).

A second electrode CE may be disposed on the light emitting layer EML. An electron transport layer may be further disposed between the second electrode CE and the light emitting layer EML. An electron injection layer may be further disposed between the electron transport layer and the second electrode CE. The electron transport layer or the electron injection layer may be commonly disposed over the pixels PX (refer to FIG. 3).

Referring to FIG. 4B, a portion of the data line DL may be disposed on the fifth insulating layer 50 in the first area AA1, and another portion of the data line DL may be disposed on the first insulating layer 10 in the second area AA2. As described with reference to FIG. 3, the data line DL may extend from the first area AA1 to the second area AA2 via the bending area BA, and the data line DL may include multiple portions disposed on different layers depending on the areas. The another portion of the data line DL, which is disposed on the first insulating layer 10, and the gate G1 of the first transistor T1 may be formed through a same process and may include a same material.

The barrier layer BRL, the buffer layer BFL, and the first insulating layer 10 to the fourth insulating layer 40 may be disposed in the second area AA2 as well as the first area AA1. A portion of the insulating layer disposed in the first area AA1 may be disposed in the second area AA2. A stack structure of the insulating layer in the second area AA2 is not particularly limited.

The pad PD may be disposed in the second area AA2. A dummy pad DMP and the pad PD may be disposed on the same insulating layer. The pad PD shown in FIG. 4B may be one of the pads PD shown in FIG. 3. The pad PD may be connected to the data line DL, e.g., an end portion of the data line DL, via a contact hole CH defined through the second insulating layer 20 to the fourth insulating layer 40.

The dummy pad DMP may be a conductive pattern that is electrically isolated. For example, the dummy pad DMP may be a floating pattern. The dummy pad DMP and the pad PD may be formed through a same process and may include a same material. The pad PD and the dummy pad DMP may be formed in the fourth conductive layer CL4 or may be formed through the same process as the conductive pattern of the input sensor IS described with reference to FIG. 4A. Other conductive patterns may be disposed between the pad PD and the data line DL shown in FIG. 4B. The conductive patterns may be formed in the second conductive layer CL2 and/or the third conductive layer CL3 and may serve as a bridge to electrically connect the data line DL to the pad PD.

Figure 5:
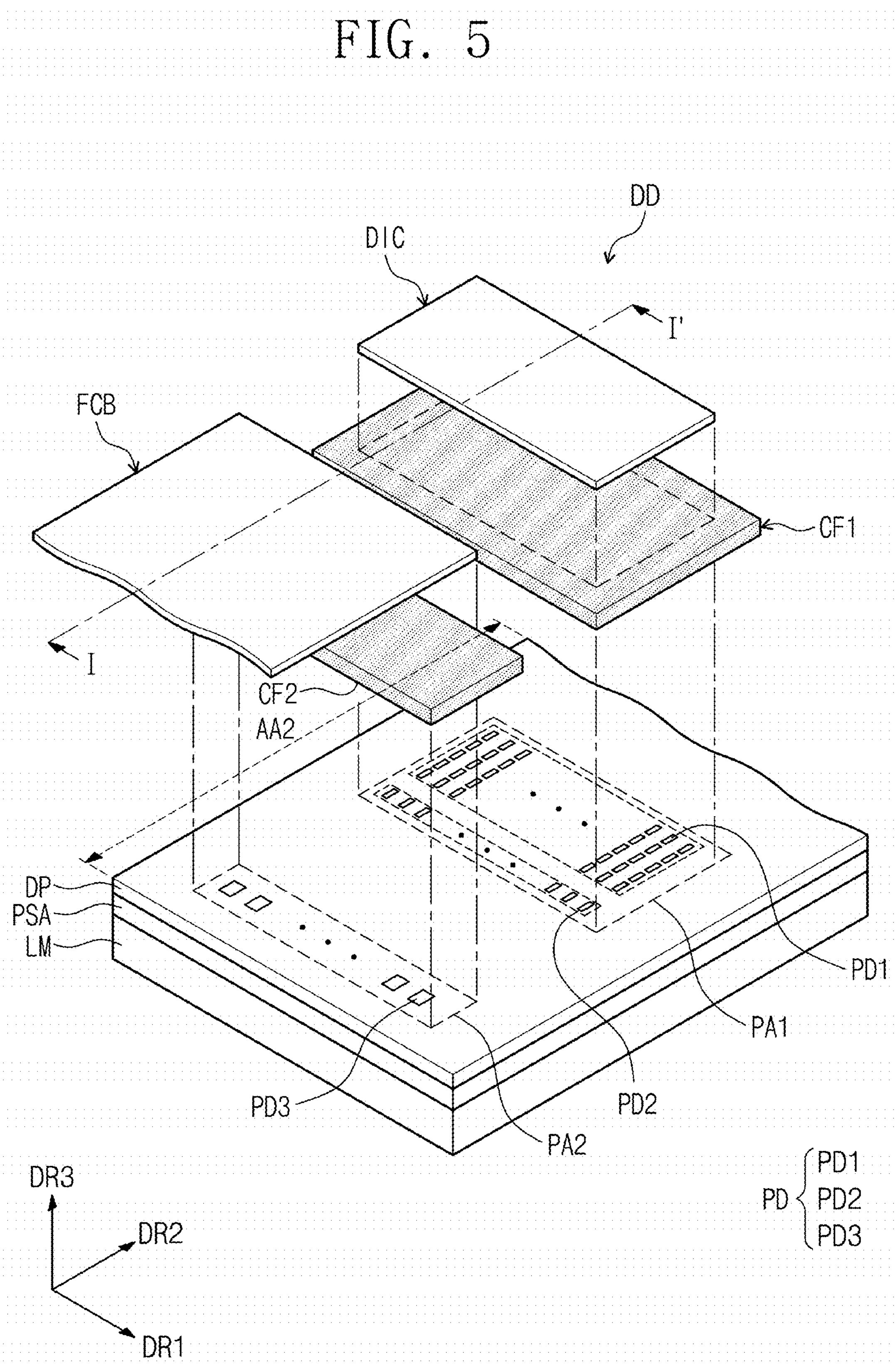
FIG. 5 is an exploded perspective view of a second area of a display device according to an embodiment of the disclosure.
Figure 6:
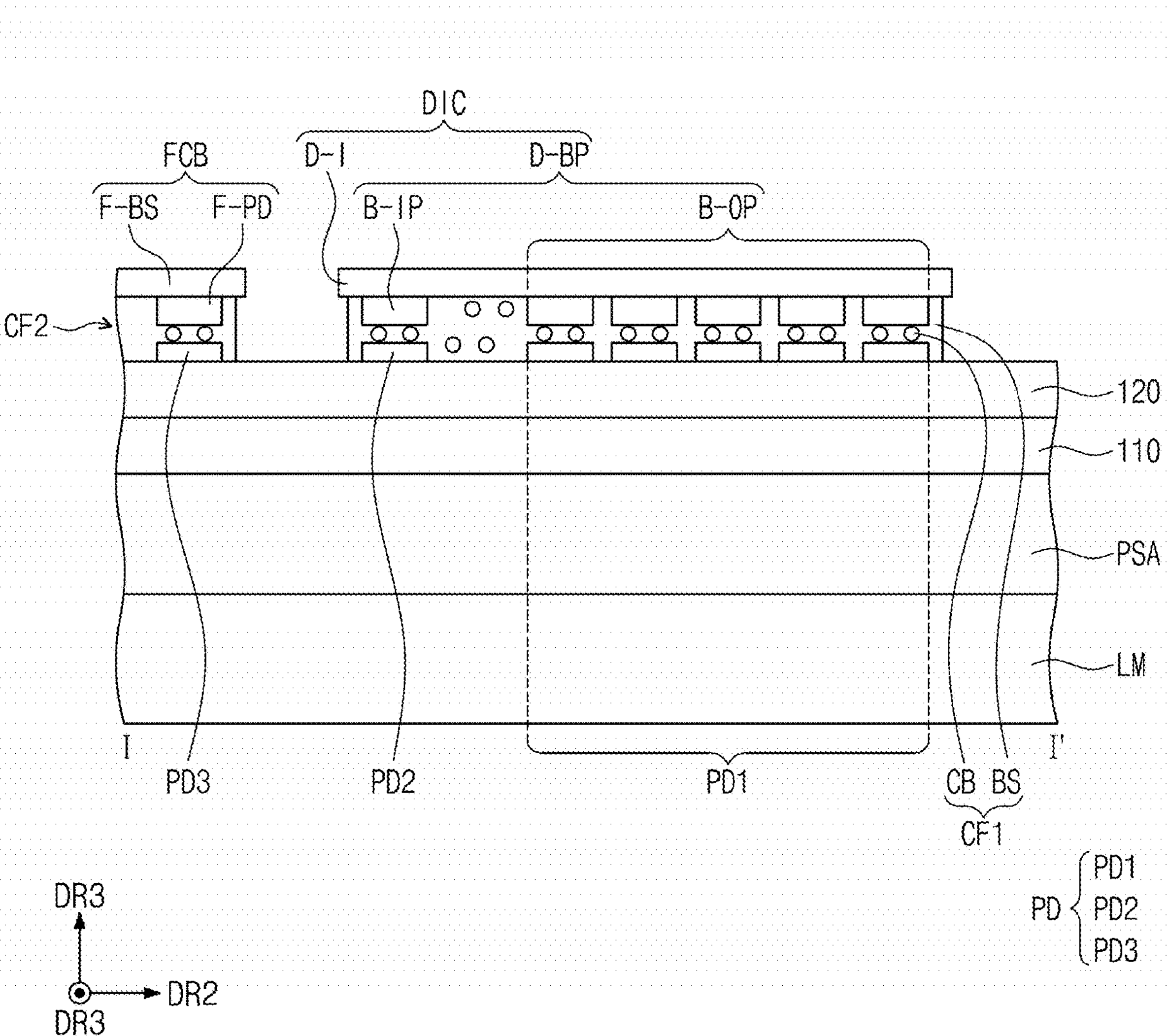
FIG. 6 is a schematic cross-sectional view taken along line I-I' of FIG. 5.

FIG. 5 is an exploded perspective view of the second area AA2 of the display device DD according to an embodiment of the disclosure. FIG. 6 is a schematic cross-sectional view taken along line I-I' of FIG. 5.

As described with reference to FIG. 3, the second area AA2 may correspond to a portion of the non-display area DP-NDA. As shown in FIG. 5, in the non-display area DP-NDA or the second area AA2, an area to which the driving circuit chip DIC is bonded may be referred to as a first pad area PA1, and an area to which the flexible circuit board FCB is bonded may be referred to as a second pad area PA2. The driving circuit chip DIC may be bonded to the first pad area PA1 by a first anisotropic conductive adhesive layer CF1, and the flexible circuit board FCB may be bonded to the second pad area PA2 by a second anisotropic conductive adhesive layer CF2. For example, the first anisotropic conductive adhesive layer CF1 may include an adhesive resin BS and conductive particles CB as shown in FIG. 6.

According to an embodiment, the first anisotropic conductive adhesive layer CF1 and the second anisotropic conductive adhesive layer CF2 may be omitted. For instance, the driving circuit chip DIC and the flexible circuit board FCB may be bonded to the first pad area PA1 and the second pad area PA2, respectively, by ultrasonic bonding.

The pads PD may include first signal pads PD1, second signal pads PD2, and third signal pads PD3. The first signal pads PD1, the second signal pads PD2, and the third signal pads PD3 may be disposed in a signal transmission path. The first signal pads PD1 may serve as input pads receiving signals from the driving circuit chip DIC, and the second signal pads PD2 may serve as output pads outputting signals to the driving circuit chip DIC. The third signal pads PD3 may serve as input pads receiving signals from the flexible circuit board FCB. A signal line may be disposed in the second area AA2 to connect a corresponding second signal pad among the second signal pads PD2 to a corresponding third signal pad among the third signal pads PD3.

As shown in FIG. 6, the driving circuit chip DIC may include a driving integrated circuit D-I and signal bumps D-BP connected to signal pads of the driving integrated circuit D-I. In the embodiment, the signal pad and the signal bump D-BP are described as being distinct from each other, however, the disclosure is not limited thereto or thereby. In an electronic component that does not include the signal bump D-BP, the signal pad may correspond to a signal terminal. For example, the flexible circuit board FCB shown in FIG. 6 may include a signal pad F-PD as its signal terminal.

The signal bumps D-BP may be connected to the first signal pads PD1 and the second signal pads PD2. The signal bumps D-BP may include first signal bumps B-OP electrically connected to the first signal pads PD1, respectively, and second signal bumps B-IP electrically connected to the second signal pads PD2, respectively. The driving circuit chip DIC may receive first signals via the second signal pads PD2 and the second signal bumps B—IP. The driving circuit chip DIC may provide second signals generated based on the first signals to corresponding data lines via the first signal bumps B-OP and the first signal pads PD1. The first signal may be an image signal that is a digital signal provided from the outside, and the second signal may be the data signal that is an analog signal. The driving circuit chip DIC may generate an analog voltage corresponding to a grayscale value of the image signal.

The flexible circuit board FCB may include a base layer F-BS and the signal pad F-PD connected to a corresponding pad among the third signal pads PD3. The base layer F-BS may be a synthetic resin film such as polyimide. The signal pad F-PD may be a portion of a signal line disposed on the base layer F-BS or another conductive pattern connected to the signal line. The flexible circuit board FCB may provide an image signal, a driving voltage, and other control signals to the driving circuit chip DIC.

FIG. 6 shows a structure in which the pads PD are disposed on the circuit layer 120, and the signal lines connected to the pads PD are not shown in FIG. 6, however, a connection relationship between the pads PD and the signal lines may be the same as the one between the pad PD and the data line DL described with reference to FIG. 4B.

Figure 7A:
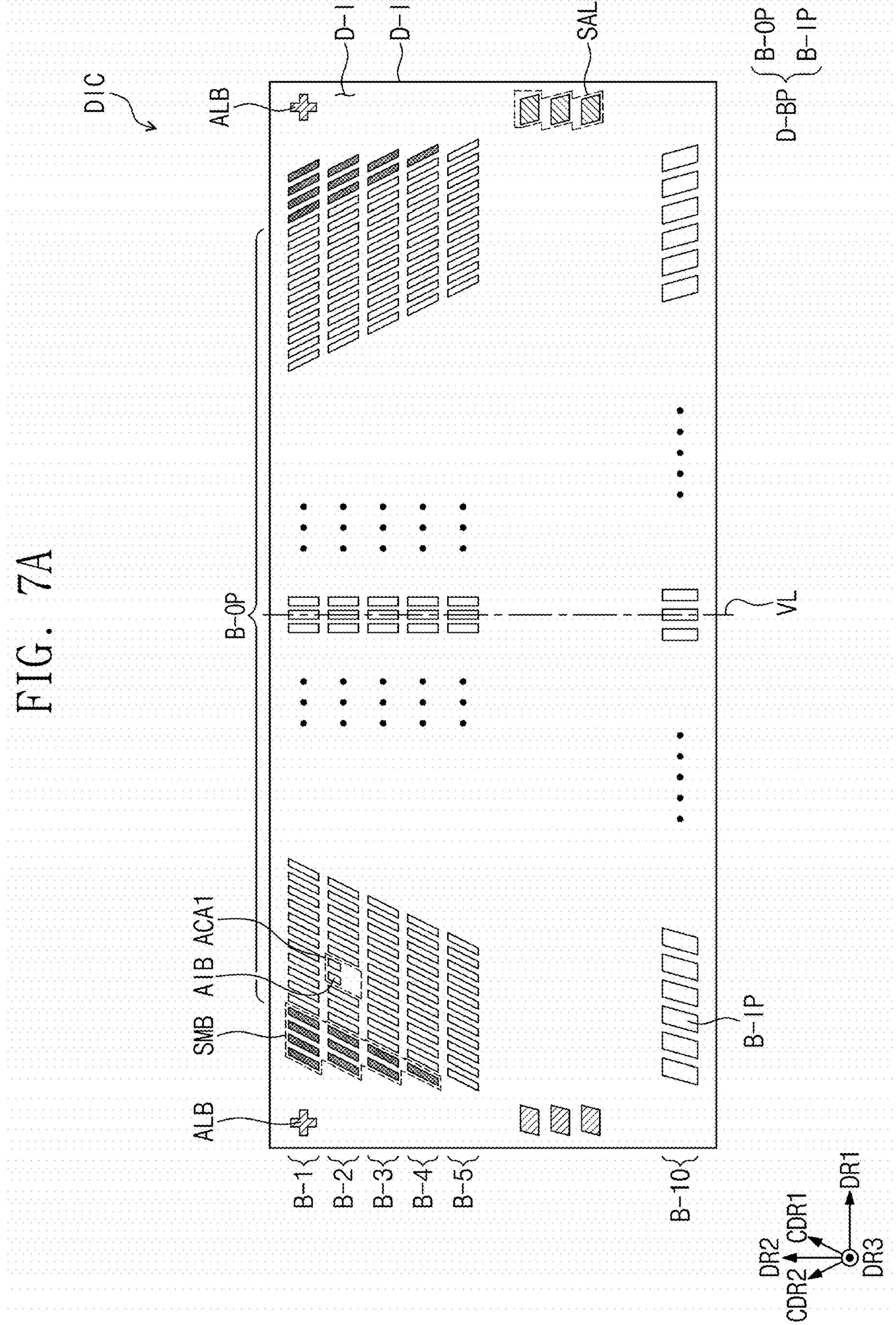
FIG. 7A is a plan view of an arrangement of bumps of a driving circuit chip according to an embodiment of the disclosure.
Figure 7B:
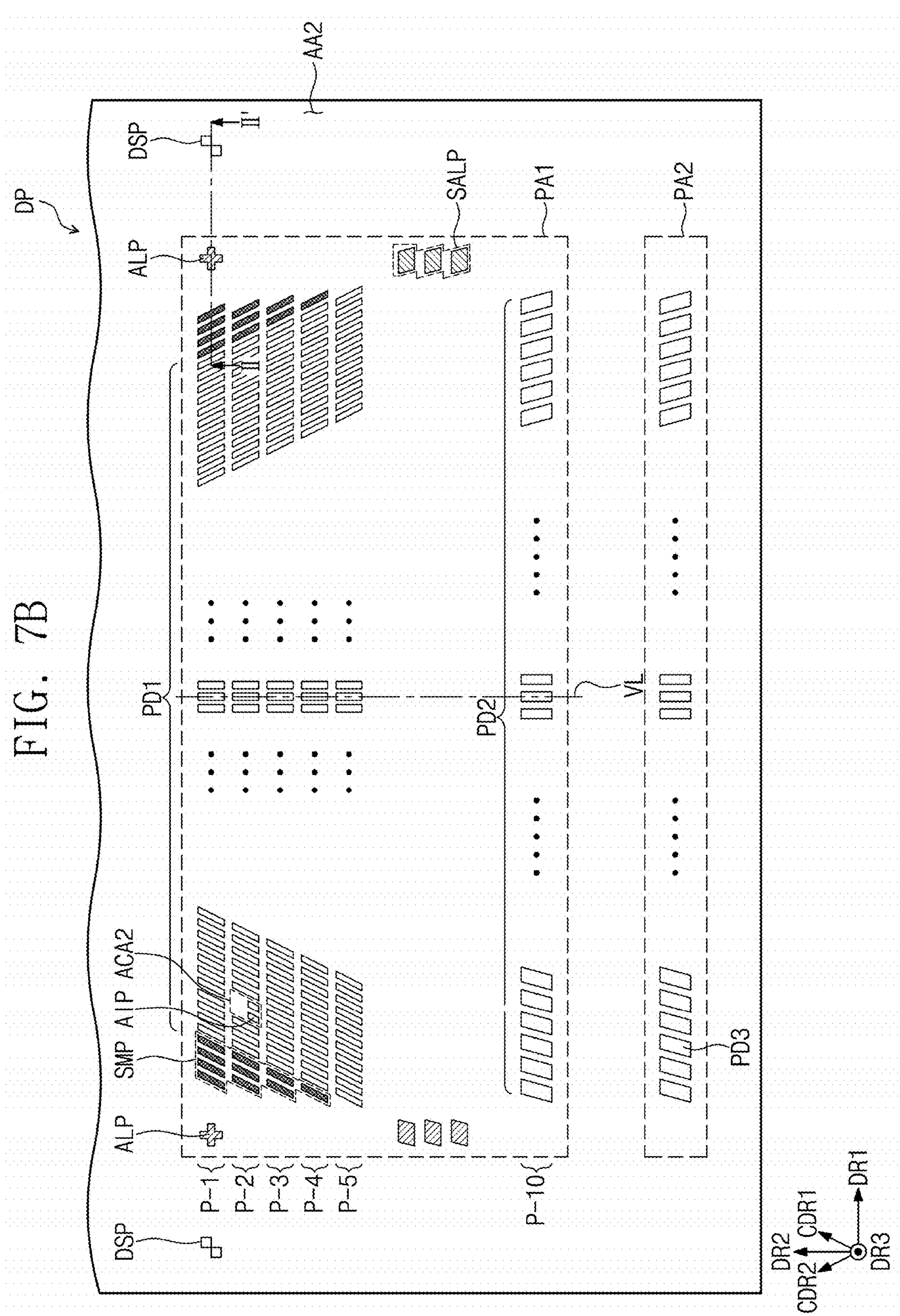
FIG. 7B is a plan view of a non-display area of a display panel according to an embodiment of the disclosure.
Figure 7C:
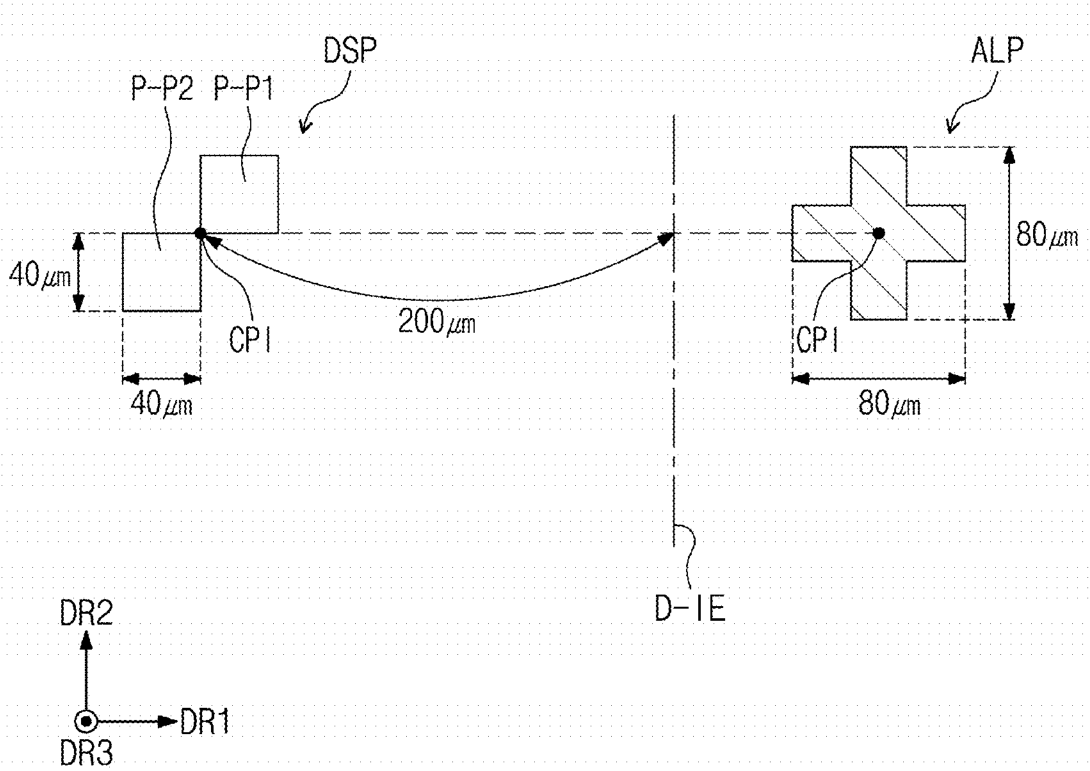
FIG. 7C is an enlarged plan view of an alignment pad and a reference pad shown in FIG. 7B.
Figure 7D:
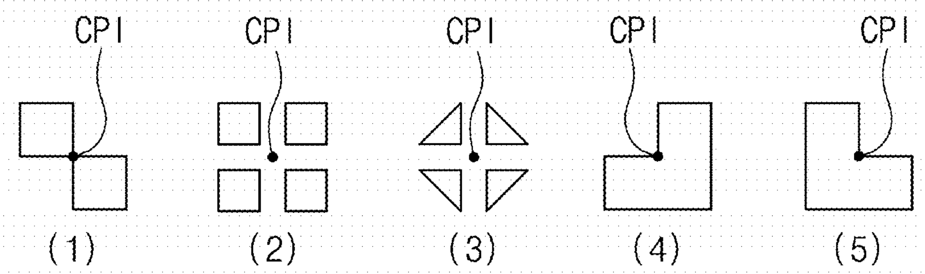
FIG. 7D is a plan view of reference pads according to an embodiment of the disclosure.

FIG. 7A is a plan view of an arrangement of the bumps of the driving circuit chip DIC according to an embodiment of the disclosure. FIG. 7B is a plan view of the second area AA2 of the display panel DP according to an embodiment of the disclosure. FIG. 7C is an enlarged plan view of an alignment pad ALP and a reference pad DSP shown in FIG. 7B. FIG. 7D is a plan view of reference pads DSP according to an embodiment of the disclosure.

Referring to FIG. 7A, an edge D-IE of the driving integrated circuit D-I may define a quadrangular shape in a plan view defined by the first direction DR1 and the second direction DR2. However, the shape of the driving integrated circuit D-I in a plan view is not particularly limited.

The first signal bumps B-OP may be arranged in multiple output rows B-1, B-2, B-3, B-4, and B-5 each extending in the first direction DR1. In the embodiment, the first signal bumps B-OP arranged in first, second, third, fourth, and fifth output rows B-1, B-2, B-3, B-4, and B-5 are shown as an embodiment, however, the disclosure is not limited thereto or thereby. The second signal bumps B-IP may be arranged in an input row B-10, and the second signal bumps B-IP arranged in the input row B-10 are shown in FIG. 7A as an embodiment. The first signal bumps B-OP and the second signal bumps B-IP may be spaced apart from each other in the second direction DR2. In the disclosure, the first direction DR1 may be referred to as a row direction, and the second direction DR2 may be referred to as a column direction.

A first center bump disposed at a center in the first direction DR1 among the first signal bumps B-OP and a second center bump disposed at a center in the first direction DR1 among the second signal bumps B-IP may be disposed on a reference line VL defined along the second direction DR2. The first center bump and the second center bump may have a shape substantially parallel to the second direction DR2.

Among the first signal bumps B-OP, the first signal bumps B-OP disposed at a left side of the reference line VL may have a slop (predetermined or selectable) with respect to the reference line VL. The first signal bumps B-OP disposed at the left side of the reference line VL may extend in a first diagonal direction CDR1. Among the first signal bumps B-OP, the first signal bumps B-OP disposed at a right side of the reference line VL may extend in a second diagonal direction CDR2. The first signal bumps B-OP disposed at the left side of the reference line VL may be arranged and inclined in a clockwise direction to form an acute angle with respect to the reference line VL. The first signal bumps B-OP disposed at the right side of the reference line VL may be arranged and inclined in a counterclockwise direction to form an acute angle with respect to the reference line VL.

An interval between adjacent first signal bumps B-OP in the first direction DR1 in each of the output rows B-1, B-2, B-3, B-4, and B-5 may be different. The interval between first signal bumps B-OP may increase from the first output row B-1 to the fifth output row B-5. Intervals between the first signal bumps B-OP arranged in the same output row may be uniform.

The second signal bumps B-IP arranged in the input row B-10 may include second signal bumps B-IP disposed at the left side of the reference line VL and second signal bumps B-IP disposed at the right side of the reference line VL. The second signal bumps B-IP disposed at the left side of the reference line VL may be arranged and inclined in the clockwise direction to form an acute angle with respect to the reference line VL. The second signal bumps B-IP disposed at the right side of the reference line VL may be arranged and inclined in the counterclockwise direction to form an acute angle with respect to the reference line VL.

The second signal bumps B-IP disposed at the left side of the reference line VL may be substantially parallel to the first signal bumps B-OP disposed at the left side of the reference line VL or may be less rotated in the clockwise direction than the first signal bumps B-OP disposed at the left side of the reference line VL. The second signal bumps B-IP and the first signal bumps B-OP, which are disposed at the left side of the reference line VL, may be inclined at different angles from each other with respect to the reference line VL.

The second signal bumps B-IP disposed at the right side of the reference line VL may be substantially parallel to the first signal bumps B-OP disposed at the right side of the reference line VL or may be less rotated in the counterclockwise direction than the first signal bumps B-OP disposed at the right side of the reference line VL. The second signal bumps B-IP and the first signal bumps B-OP, which are disposed at the right side of the reference line VL, may be inclined at different angles from each other with respect to the reference line VL.

The driving circuit chip DIC may include an alignment bump ALB disposed at an end of at least one row among the output rows B-1, B-2, B-3, B-4, and B-5. In the embodiment, two alignment bumps ALB disposed at both ends of the first output row B-1 are shown as an embodiment.

The alignment bumps ALB may be an identification mark or an alignment mark used to locate a position of the driving circuit chip DIC or to align the driving circuit chip DIC with the display panel DP in the process of bonding the driving circuit chip DIC to the display panel DP.

FIG. 7A shows the alignment bumps ALB having a cross shape as an embodiment, however, the shape of the alignment bumps ALB is not limited thereto or thereby. According to an embodiment, the driving circuit chip DIC may include an engraved pattern or an insulating pattern to replace the alignment bump ALB as an alignment mark.

The alignment bumps ALB and the first signal bumps B-OP may have substantially the same thickness in the third direction DR3. In the disclosure, the expression "substantially the same thickness" not only means a case that the thicknesses of the components are exactly the same as each other but also means a case that the thicknesses of the components are the same within a range including fabrication errors that may occur in the process despite the same design. The alignment bumps ALB and the first signal bumps B-OP may have a thickness in a range of about 7 um to about 10 um. The first signal bumps B-OP and the second signal bumps B-IP may have substantially the same thickness.

The alignment bumps ALB and the first signal bumps B-OP may include a same material. The alignment bumps ALB and the first signal bumps B-OP may include a same conductive metal. The alignment bumps ALB and the first signal bumps B-OP may be formed by depositing a metal on the driving integrated circuit D-I and performing a patterning process on the metal one time.

The driving circuit chip DIC may further include a sub-alignment bump SALB aligned with the alignment bumps ALB in the second direction DR2. In the disclosure, the sub-alignment bump SALB may be used as an identification mark or an alignment mark to locate a position of the driving circuit chip DIC in the process of bonding the driving circuit chip DIC to the display panel DP or to determine whether an alignment of the driving circuit chip DIC is appropriate in a process of inspecting the alignment of the driving circuit chip DIC. The alignment bump ALB may be used to locate the position of the driving circuit chip DIC or to determine whether the alignment of the driving circuit chip DIC is appropriate in the process of inspecting the alignment of the driving circuit chip DIC, however, the sub-alignment bump SALB may be preliminarily formed in case the alignment bump ALB cannot be used.

In case that the alignment bump ALB cannot be used, the sub-alignment bump SALB may be aligned with the alignment bump ALB in the second direction DR2 in order for an inspection device to readily recognize the sub-alignment bump SALB. In other words, the alignment bump ALB and the sub-alignment bump SALB may have a same coordinate information in an X-axis and may have different coordinate information in a Y-axis. In the embodiment, the X-axis may be parallel to the first direction DR1, and the Y-axis may be parallel to the second direction DR2.

The sub-alignment bump SALB and the alignment bump ALB may have substantially the same thickness in the third direction DR3. The sub-alignment bump SALB and the alignment bump ALB may include a same material and may be formed through a same process.

The driving circuit chip DIC may further include multiple dummy bumps SMB. The dummy bumps SMB may be disposed between an outermost first signal bump among the first signal bumps B-OP and the edge D-IE of the driving circuit chip DIC in at least one row among the output rows B-1, B-2, B-3, B-4, and B-5. The dummy bumps SMB may be arranged in the first output row B-1, the second output row B-2, the third output row B-3, and the fourth output row B-4.

Since distances between the outermost first signal bumps of the output rows B-1, B-2, B-3, B-4, and B-5 and the edge D-IE of the driving circuit chip DIC are different depending on the output rows B-1, B-2, B-3, B-4, and B-5, the dummy bumps SMB may be disposed to fill areas between the outermost first signal bumps of the output rows B-1, B-2, B-3, B-4, and B-5 and the edge D-IE of the driving circuit chip DIC. Distances between outermost dummy bumps SMB and the edge D-IE of the driving circuit chip DIC may be same as the distances between the outermost first signal bumps B-OP of the fifth output row B-5 and the edge D-IE of the driving circuit chip DIC.

The dummy bumps SMB and the alignment bump ALB may have substantially the same thickness in the third direction DR3. The dummy bumps SMB and the alignment bump ALB may include a same material and may be formed through a same process. Each of the alignment bump ALB, the sub-alignment bump SALB, and the dummy bumps SMB may be a bump that is electrically isolated. Each of the alignment bump ALB, the sub-alignment bump SALB, and the dummy bumps SMB may be a bump that does not output a separate signal.

The driving circuit chip DIC may include an alignment inspection area ACA1. The alignment inspection area ACA1 may be an area to inspect whether the alignment of the driving circuit chip DIC with respect to the display panel DP is appropriate. The alignment inspection area ACA1 may be defined in a portion of the output rows B-1, B-2, B-3, B-4, and B-5. In the embodiment, the alignment inspection area ACA1 disposed in the second output row B-2 is shown as an embodiment.

Among the output rows B-1, B-2, B-3, B-4, and B-5, the alignment inspection area ACA1 may be formed in an area where the first signal bumps B-OP are not disposed, and an alignment inspection bump AIB may be disposed in the alignment inspection area ACA1. The alignment inspection bump AIB may also be a bump that is electrically isolated. The alignment inspection bump AIB and the first signal bumps B-OP may be formed through a same process and may have a same thickness in the third direction DR3. An additional alignment inspection area ACA1 may be disposed at the right side of the reference line VL.

FIG. 7B is an enlarged plan view showing the first pad area PA1 and the second pad area PA2 shown in FIG. 5. The driving circuit chip DIC described with reference to FIG. 7A may be bonded to the first pad area PA1, and the flexible circuit board FCB described with reference to FIG. 5 may be bonded to the second pad area PA2.

The first signal pads PD1 corresponding to the first signal bumps B-OP may be disposed in the first pad area PAL As shown in FIG. 7B, the first signal pads PD1 may be arranged in multiple input rows P-1, P-2, P-3, P-4, and P-5 each extending in the first direction DR1. The second signal pads PD2 may be arranged in an output row P-10. The first signal pads PD1 and the second signal pads PD2 and the pad PD shown in FIG. 4B may have a same cross-sectional structure.

A first center pad disposed at a center in the first direction DR1 among the first signal pads PD1 and a second center pad disposed at a center in the first direction DR1 among the second signal pads PD2 may be disposed on the reference line VL. The first center pad may be bonded to the first center bump described with reference to FIG. 7A, and the second center pad may be bonded to the second center bump described with reference to FIG. 7A.

Among the first signal pads PD1, the first signal pads PD1 disposed at the left side of the reference line VL may be arranged to have a slope (predetermined or selectable) with respect to the reference line VL. The first signal pads PD1 disposed at the left side of the reference line VL may extend in the first diagonal direction CDR1. Among the first signal pads PD1, the first signal pads PD1 disposed at the right side of the reference line VL may extend in the second diagonal direction CDR2.

The second signal pads PD2 arranged in the output row P-10 may also include the second signal pads PD2 disposed at the left side of the reference line VL and the second signal pads PD2 disposed at the right side of the reference line VL. The second signal pads PD2 may be arranged to correspond to the second signal bumps B-IP.

Dummy pads SMP corresponding to the dummy bumps SMB may be arranged in the first pad area PAL The alignment pad ALP corresponding to the alignment bump ALB may be arranged in the first pad area PA1. In the embodiment, two alignment pads ALP respectively aligned with two alignment bumps ALB (refer to FIG. 7A) are shown as an embodiment. The alignment pads ALP may be an identification mark or an alignment mark used to align the driving circuit chip DIC with the display panel DP in the process of bonding the driving circuit chip DIC to the display panel DP. The alignment pads ALP and the alignment bumps ALB may have a same shape in a plan view, however, the disclosure is not limited thereto or thereby.

A sub-alignment pad SALP corresponding to the sub-alignment bump SALB (refer to FIG. 7A) may be disposed in the first pad area PA1. The sub-alignment pad SALP and the sub-alignment bump SALB may have a same shape in a plan view. The sub-alignment pad SALP may be an identification mark or an alignment mark used to align the driving circuit chip DIC with the display panel DP in the process of bonding the driving circuit chip DIC to the display panel DP or to determine whether the alignment of the driving circuit chip DIC with the display panel DP is appropriate in the process of inspecting the alignment of the driving circuit chip DIC.

The reference pads DSP may be arranged spaced apart from the first pad area PA1 in the second area AA2. The reference pads DSP may be arranged adjacent to the alignment pads ALP in a one-to-one correspondence. The alignment pads ALP may not overlap the first pad area PA1 and may not overlap the driving circuit chip DIC in a plan view. The reference pads DSP may be an identification mark or an alignment mark that provides a reference position to locate a position of an alignment inspection area ACA2 in the process of inspecting the alignment of the driving circuit chip DIC. Substantially, the alignment pads ALP or the sub-alignment pad SALP may be used to locate the position of the alignment inspection area ACA2 in the process of inspecting the alignment of the driving circuit chip DIC, however, the reference pads DSP may be preliminarily formed in case the alignment pads ALP and the sub-alignment pad SALP cannot be used.

The alignment inspection area ACA2 may be defined in a portion of the input rows P-1, P-2, P-3, P-4, and P-5 arranged in the first pad area PA1. Among the input rows P-1, P-2, P-3, P-4, and P-5, the alignment inspection area ACA2 may be formed in an area where the first signal pads PD1 are not arranged, and an alignment inspection pad AIP may be arranged in the alignment inspection area ACA2. In the embodiment, the alignment inspection area ACA2 is defined in the second input row P-2 as an embodiment. The alignment inspection pad AIP may not overlap the alignment inspection bump AIB described with reference to FIG. 7A.

The alignment inspection pad AIP and the first signal pads PD1 may be formed through a same process and may have a same thickness in the third direction DR3. An additional alignment inspection area ACA2 may be disposed at the right side of the reference line VL.

The reference pads DSP may be aligned with the alignment pad ALP in the first direction DR1 in order for the inspection device to readily recognize the reference pads DSP. In other words, the alignment pad ALP and the reference pads DSP may have a same coordinate information in the Y-axis and may have different coordinate information in the X-axis.

Referring to FIG. 7C, the reference pad DSP may be spaced apart from the edge D-IE of the driving circuit chip DIC by about 200 micrometers. The reference pad DSP may include a first portion P-P1 and a second portion P-P2, which face each other in a direction inclined about 45 degrees in the counterclockwise direction with respect to the first direction DR1. Each of the first portion P-P1 and the second portion P-P2 may have a square shape in a plan view. A vertex where the first portion P-P1 overlaps the second portion P-P2 may correspond to a center CPI of the reference pad DSP. The center CPI of the reference pad DSP may be aligned with a center CPI of the alignment pad ALP in the first direction DR1.

Referring to FIG. 7D, the shape of the reference pads DSP may be changed to have various ways in a plan view. The shape of the reference pads DSP may be symmetrical or asymmetrical with respect to the second direction DR2. The shape of the reference pads DSP may be symmetrical with respect to the first diagonal direction CDR1 or the second diagonal direction CDR2. The reference pads DSP may have a shape such that the center CPI can be readily calculated.

The alignment pads ALP, the sub-alignment pad SALP, and the reference pads DSP described with reference to FIGS. 7B to 7D may be the dummy pad DMP shown in FIG. 4B. The alignment pads ALP, the sub-alignment pad SALP, and the reference pads DSP may be electrically isolated, may be disposed on the same insulating layer, and may include a same material as that of the first signal pads PD1.

FIGS. 8A to 8G illustrate a method of inspecting the alignment of the driving circuit chip DIC according to an embodiment of the disclosure.

Referring to FIGS. 8A to 8G, a vision inspection machine may be used in the method of inspecting the alignment of the driving circuit chip DIC. The vision inspection machine may be Auto Trace Tester. The vision inspection machine may include a camera device AID. Referring to FIGS. 8A to 8G, the camera device AID may be disposed under the display panel DP, however, the disclosure not limited thereto or thereby. The display panel DP may be rotated from the embodiment in FIGS. 5 and 6, and the camera device AID may be disposed above the display panel DP.

Figure 8A:
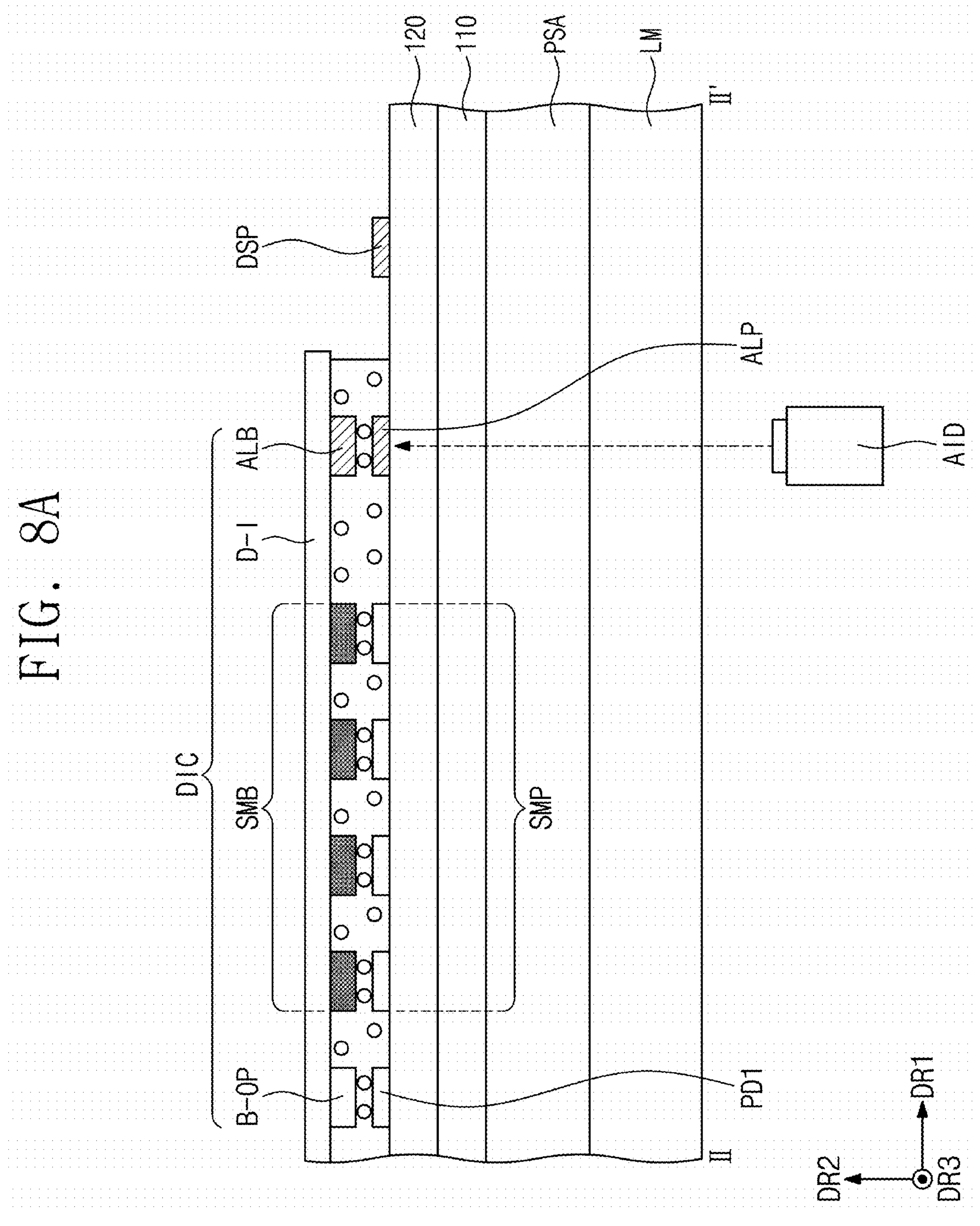

Referring to FIG. 8A, the vision inspection machine may detect the position of the alignment pad ALP of the display panel DP using the camera device AID. FIG. 8A is a schematic cross-sectional view along line II-IF of FIG. 7B.

Figure 8B:
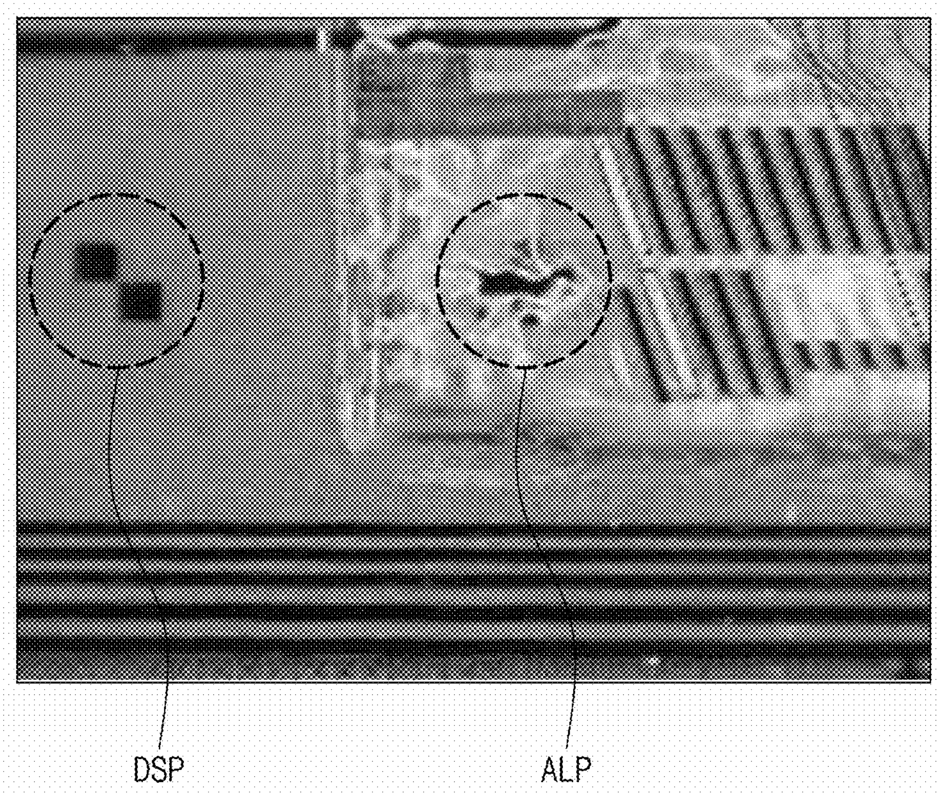

FIG. 8B shows an image of the alignment pad ALP. It may be observed that it is difficult to accurately detect the shape of the alignment pad ALP due to noise, and accordingly, the center of the alignment pad ALP is more difficult to detect.

Figure 8C:
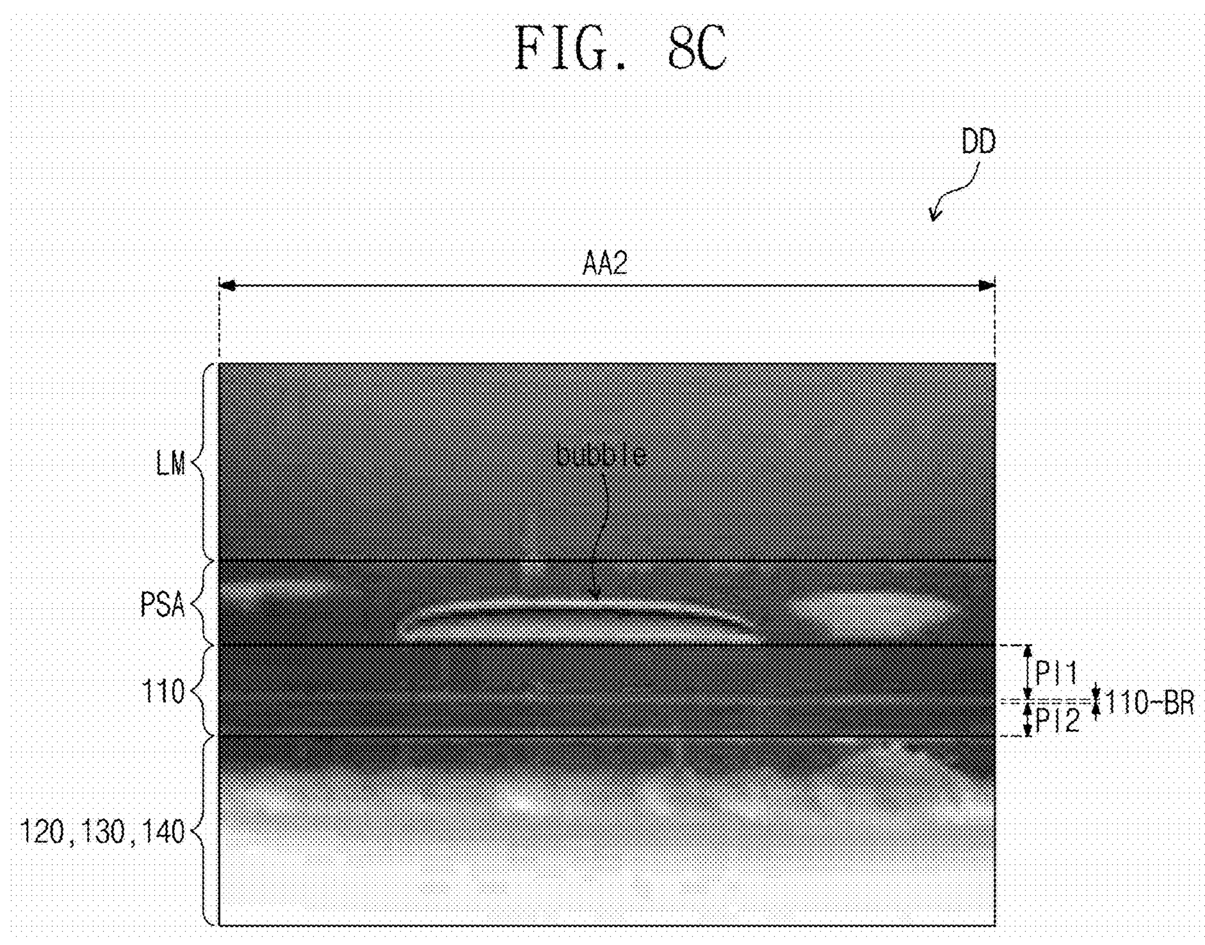

The noise appearing on the alignment pad ALP in FIG. 8B is caused by bubbles generated during the bonding process between the display panel DP and the driving circuit chip DIC. This may be seen from an image showing a cross-sectional view of the inverted display device DD in FIG. 8C. Referring to FIG. 8C, the base layer 110 may include a first synthetic resin layer PI1 and a second synthetic resin layer PI2. The first synthetic resin layer PI1 and the second synthetic resin layer PI2 may include polyimide. The base layer 110 may include an inorganic layer 110-BR between the first synthetic resin layer PI1 and the second synthetic resin layer PI2.

The adhesive layer PSA may be disposed in the second area AA2 to attach the lower member LM to the base layer 110. A relatively thick adhesive layer PSA may be applied to more firmly attach the lower member LM to the base layer 110 since the foldable display device is repeatedly folded and unfolded. The adhesive layer PSA may have a thickness in a range of about 25 micrometers to about 30 micrometers.

In the bonding process of the display panel DP and the driving circuit chip DIC, a high temperature and pressure process may be performed. A gas may be discharged from the adhesive layer PSA and may be collected between the base layer 110 and the adhesive layer PSA. The bubbles generated may act as noise in the process of detecting the position of the alignment pad ALP of the display panel DP.

Figure 8D:
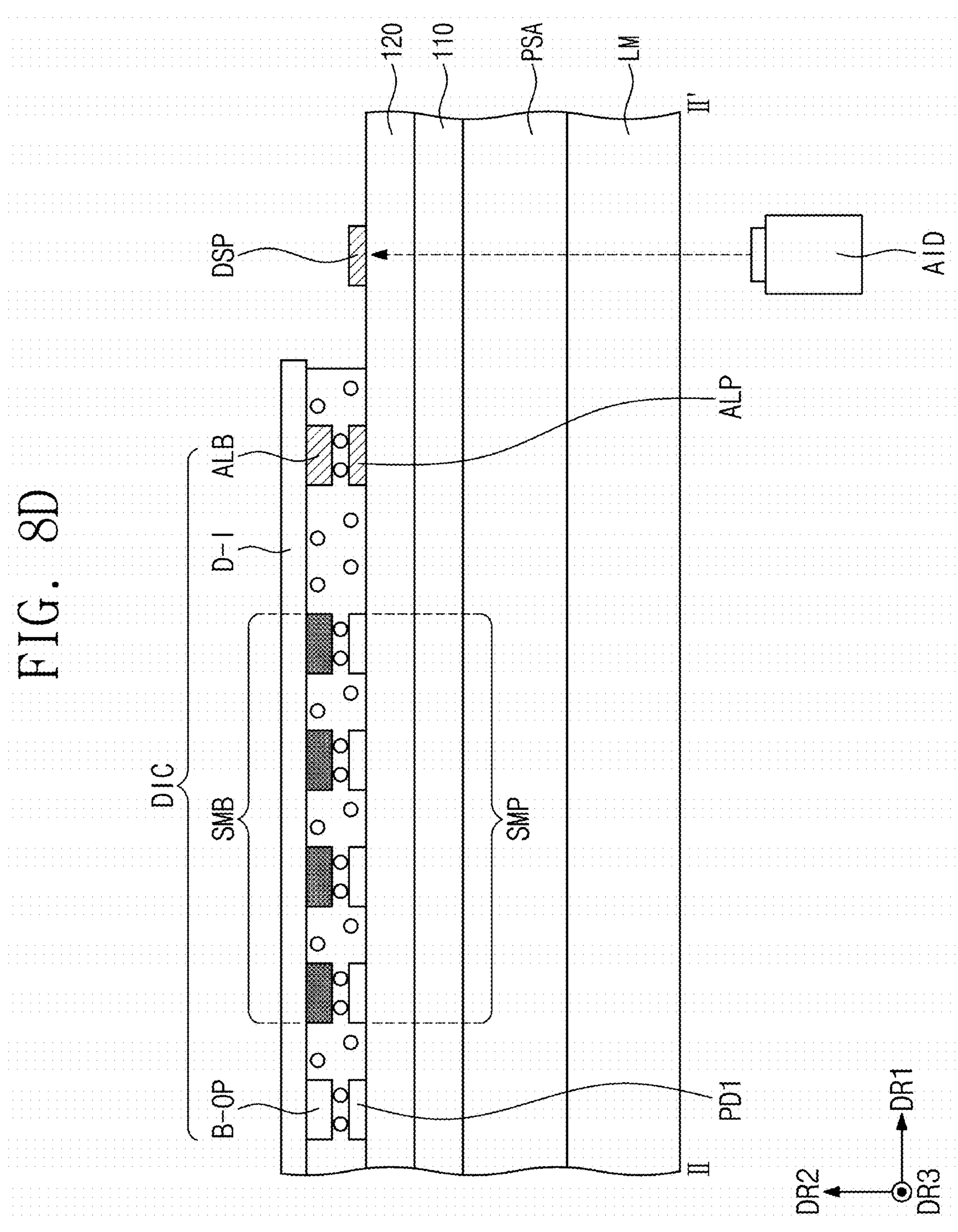

The vision inspection machine may try to detect a position of the alignment pad ALP. The vision inspection machine may determine if the position of the alignment pad is not detected. As described with reference to FIGS. 8A to 8C, in case that the position of the alignment pad ALP of the display panel DP is not detected, the vision inspection machine may detect a position of the reference pad DSP of the display panel DP as shown in FIG. 8D. As shown in FIG. 7B, since the alignment pad ALP and the reference pad DSP have different coordinates only in the X-axis, the reference pad DSP may be detected by moving the camera device AID in the first direction DR1.

Since the reference pad DSP does not overlap the driving circuit chip DIC, bubbles may not be generated in an area of the adhesive layer PSA overlapping the reference pad DSP. This is because the area of the adhesive layer PSA overlapping the reference pad DSP is not pressurized or is pressurized at a relatively low pressure in the bonding process between the display panel DP and the driving circuit chip DIC. Accordingly, the camera device AID may accurately detect the position of the reference pad DSP.

Figure 8E:
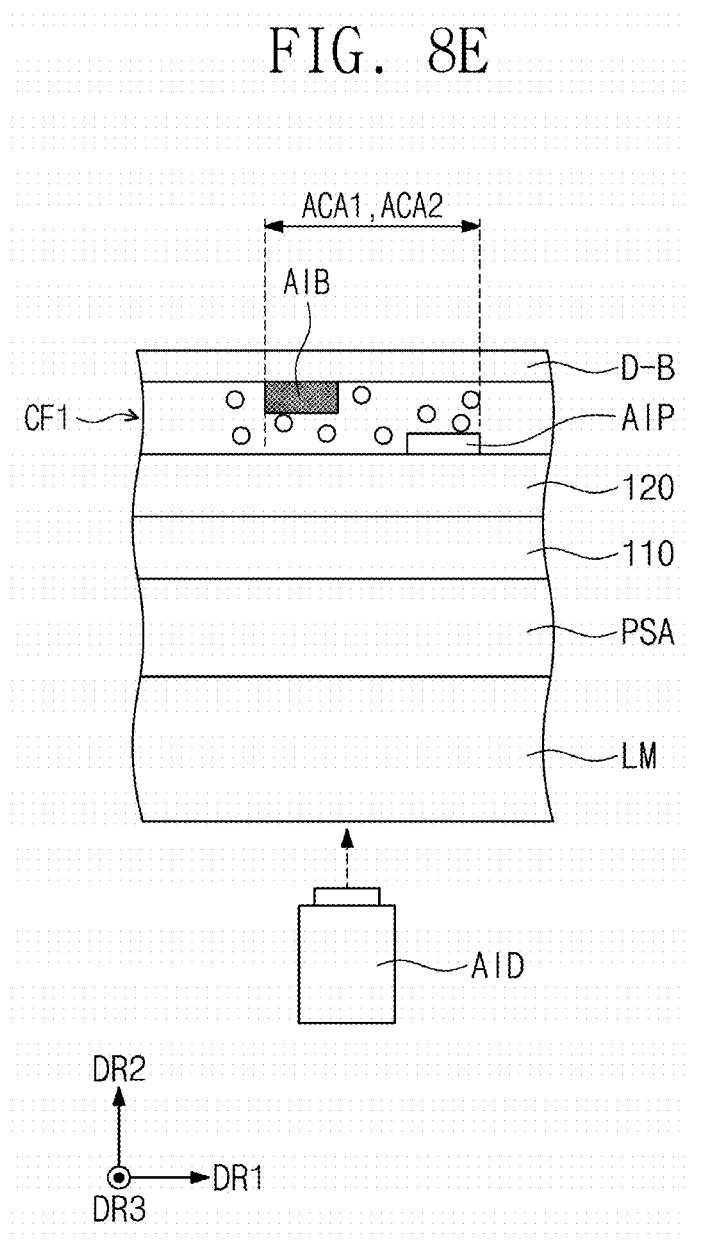
Figure 8F:
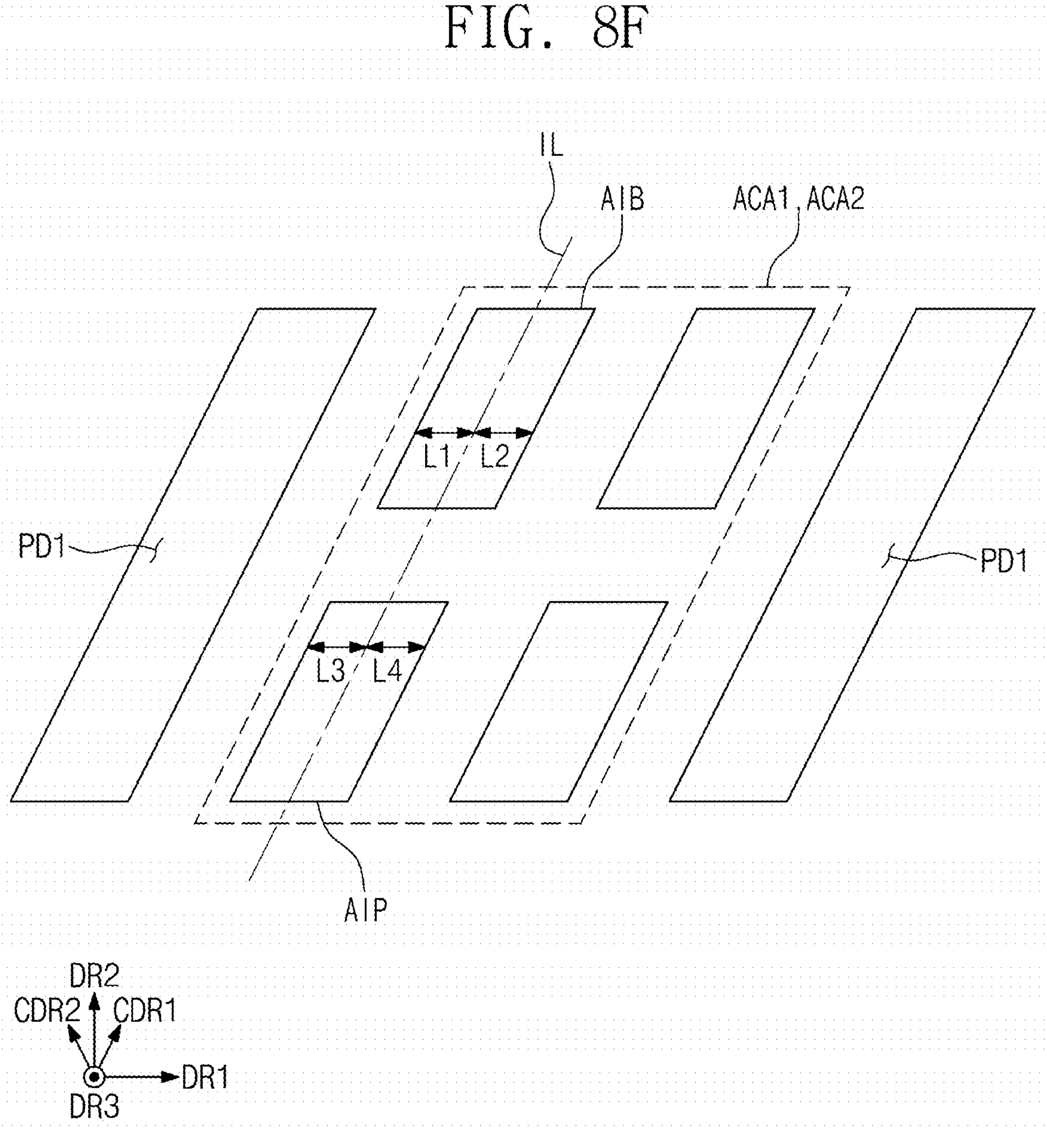

Referring to FIGS. 8E and 8F, a position of the alignment inspection area ACA2 of the display panel DP may be detected based on the position of the reference pad DSP. The vision inspection machine may move the camera device AID to the alignment inspection area ACA2 based on coordinate information of the reference pad DSP and coordinate information of the alignment inspection area ACA2. The vision inspection machine may store the coordinate information of the alignment inspection area ACA2 spaced apart from the reference pad DSP in a memory. The vision inspection machine may store the coordinate information of the alignment inspection area ACA2, which are entered on the assumption that the position of the reference pad DSP is an origin, in the memory.

Referring to FIG. 8F, the vision inspection machine may inspect an alignment state of the alignment inspection pad AIP and the alignment inspection bump AIB. The vision inspection machine may inspect the alignment state of the alignment inspection pad AIP and the alignment inspection bump AIB from the image of the alignment inspection area ACA2.

Referring to FIGS. 7A, 7B, and 8F, the alignment inspection area ACA1 of the driving circuit chip DIC and the alignment inspection area ACA2 of the display panel DP may be disposed closer to the first signal pads PD1 than the alignment bump ALB and the alignment pad ALP. This is to determine an alignment state of the first signal pad PD1 and the first signal bump B-OP based on the alignment state of the alignment inspection pad AIP and the alignment inspection bump AIB. Similar misalignment may occur in the alignment inspection pad AIP and the alignment inspection bump AIB, which are respectively adjacent to the first signal pad PD1 and the first signal bump B-OP, and thus, the alignment state of the first signal pad PD1 and the first signal bump B-OP may be determined based on the alignment state of the alignment inspection pad AIP and the alignment inspection bump AIB.

In case that the alignment inspection pad AIP overlaps the alignment inspection bump AIB, it may be difficult to distinguish edges of the alignment inspection pad AIP and the alignment inspection bump AIB from each other. Accordingly, the alignment inspection pad AIP and the alignment inspection bump AIB may be arranged not to overlap each other in a plan view to readily distinguish the edges of the alignment inspection pad AIP from the edges of the alignment inspection bump AIB.

The alignment inspection bump AIB may have an area smaller than an area of the first signal bump B-OP in a plan view, and the alignment inspection pad AIP may have an area smaller than an area of the first signal pad PD1 in a plan view. Accordingly, both the alignment inspection bump AIB and the alignment inspection pad AIP may be arranged in an area where one first signal pad PD1 or one first signal bump B-OP may be disposed.

On the left side of the reference line VL, the alignment inspection pad AIP may be substantially aligned with the alignment inspection bump AIB in the first diagonal direction CDR1 in which the first signal pad PD1 extends. Whether the alignment inspection pad AIP is aligned with the alignment inspection bump AIB may be determined by measuring a distance between an imaginary line IL extending in the first diagonal direction CDR1 and the edge of each of the alignment inspection pad AIP and the alignment inspection bump AIB.

A distance L1 (hereinafter, referred to as a first distance) between the imaginary line IL and a left edge of the alignment inspection bump AIB and a distance L2 (hereinafter, referred to as a second distance) between the imaginary line IL and a right edge of the alignment inspection bump AIB may be measured. A distance L3 (hereinafter, referred to as a third distance) between the imaginary line IL and a left edge of the alignment inspection pad AIP and a distance L4 (hereinafter, referred to as a fourth distance) between the imaginary line IL and a right edge of the alignment inspection pad AIP may be measured. In case that the first distance L1 is equal to the third distance L3 and the second distance L2 is equal to the fourth distance L4, it may be determined that the alignment inspection pad AIP is substantially aligned with the alignment inspection bump AIB. The first distance L1 to the fourth distance L4 may be measured at multiple points. The method of inspecting the alignment between the alignment inspection pad AIP and the alignment inspection bump AIB is an embodiment of the disclosure, and the disclosure is not limited thereto or thereby.

According to an embodiment, whether the alignment inspection pad AIP is aligned with the alignment inspection bump AIB may be determined by measuring an angle between the imaginary line IL extending in the first diagonal direction CDR1 and the edge of each of the alignment inspection pad AIP and the alignment inspection bump AIB. In case that the left edge of the alignment inspection pad AIP and the left edge of the alignment inspection bump AIB are aligned with the imaginary line IL, it may be determined that the alignment inspection pad AIP is substantially aligned with the alignment inspection bump AIB. In case that the left edge of the alignment inspection pad AIP is aligned with the imaginary line IL and the left edge of the alignment inspection bump AIB is not aligned with the imaginary line IL, whether the alignment inspection pad AIP is aligned with alignment inspection bump AIB may be determined by measuring an angle between the imaginary line IL and the left edge of the alignment inspection bump AIB. In case that the angle is smaller than a reference value, it may be determined that the alignment inspection pad AIP is substantially aligned with the alignment inspection bump AIB.

Figure 8G:
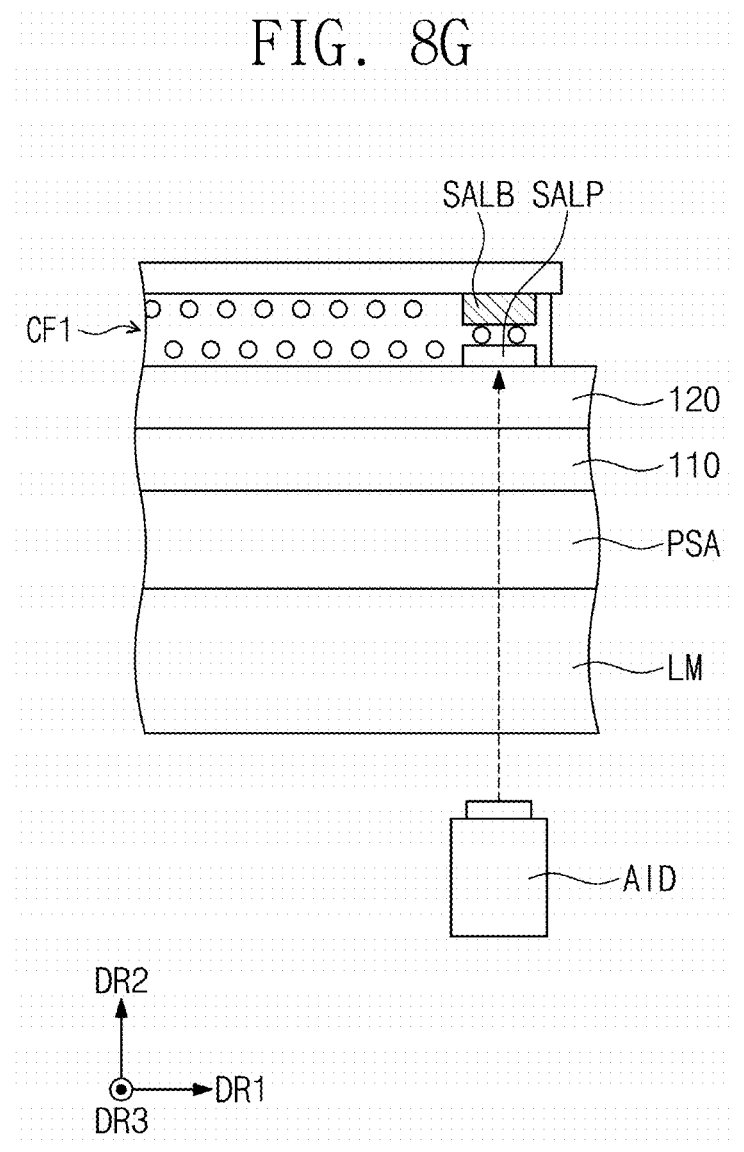

FIG. 8G shows the sub-alignment pad SALP aligned with the sub-alignment bump SALB. As described with reference to FIGS. 8A to 8C, in case that the position of the alignment pad ALP of the display panel DP is not detected, the vision inspection machine may detect the position of the sub-alignment pad SALP as shown in FIG. 8G.

In case that bubbles are not generated in the area overlapping the sub-alignment pad SALP, i.e., in case that the sub-alignment pad SALP is clearly detected, the camera device AID may move to the position of the alignment inspection pad AIP of the display panel DP described with reference to FIG. 8E based on the position of the sub-alignment pad SALP. The vision inspection machine may store coordinate information of the alignment inspection area ACA2, which are entered on the assumption that the position of the sub-alignment pad SALP is an origin point, in the memory. With these information, the vision inspection machine may move the camera device AID to the position of the alignment inspection area ACA2 of FIG. 8F from the position of the alignment inspection pad AIP.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments.

What is claimed is:

1. A display device comprising:
- a display panel comprising a display area through which an image is displayed and a non-display area defined adjacent to the display area;
- a driving circuit chip disposed in the non-display area and electrically connected to the display panel, and
- a flexible circuit board disposed in the non-display area and electrically connected to the display panel,
- wherein the driving circuit chip comprises:
  - a signal bump; and
  - an alignment bump, and
- the display panel comprises:
  - a pixel disposed in the display area;
  - a first signal pad disposed in the non-display area and corresponding to the signal bump;
  - a second signal pad disposed in the non-display area and corresponding to the flexible circuit board;
  - an alignment pad disposed in the non-display area and corresponding to the alignment bump;
  - a reference pad that is disposed in the non-display area and does not overlap the driving circuit chip or the flexible circuit board in a plan view; and
  - a signal line disposed in the display area and the non-display area and electrically connecting the pixel and the signal pad,
- wherein the reference pad and the alignment pad are spaced apart from one another in a first direction in a plan view and a center of the reference pad is aligned with a center of the alignment pad in a second direction in which the display area and the flexible circuit board are spaced apart from one another, the first direction being perpendicular to the second direction.

2. The display device of claim 1, wherein the alignment pad, the signal pad, and the reference pad comprise a same material.

3. The display device of claim 1, wherein the alignment pad, the signal pad, and the reference pad are disposed on a same insulating layer.

4. The display device of claim 1, wherein the pixel comprises:
- a light emitting element; and
- a transistor electrically connected to the light emitting element and the signal line, and
- a portion of the signal line and a gate of the transistor comprise a same material.

5. The display device of claim 4, wherein at least one insulating layer is disposed between the portion of the signal line and the signal pad, and
- the signal pad is electrically connected to the portion of the signal line via a contact hole defined through the at least one insulating layer.

6. The display device of claim 1, further comprising:
- a lower member disposed under the display panel; and
- an adhesive layer attaching the display panel to the lower member,
- wherein the adhesive layer overlaps the driving circuit chip in a plan view.

7. The display device of claim 6, wherein a thickness of the adhesive layer is in a range of about 25 micrometers to about 30 micrometers in a thickness direction of the display panel.

8. The display device of claim 1, wherein each of the alignment pad and the reference pad is electrically isolated.

9. The display device of claim 1, wherein the driving circuit chip further comprises an alignment inspection bump, and the display panel further comprises an alignment inspection pad that is disposed in the non-display area, overlaps the driving circuit chip in a plan view, and does not overlap the alignment inspection bump in a plan view.

10. The display device of claim 9, wherein the alignment inspection bump is disposed closer to the signal bump than the alignment bump, an area of the alignment inspection bump is less than an area of the signal bump in a plan view, and an area of the alignment inspection pad is less than an area of the signal pad in a plan view.

11. The display device of claim 9, wherein the signal bump extends in a first diagonal direction, each of the alignment inspection bump and the alignment inspection pad extends substantially parallel to the signal bump in a plan view, and the alignment inspection bump and the alignment inspection pad are substantially aligned with each other in the first diagonal direction.

12. The display device of claim 9, wherein each of the alignment inspection bump and the alignment inspection pad is electrically isolated.

13. The display device of claim 1, wherein the display device is foldable.

14. The display device of claim 1, wherein the signal bump and the signal pad are electrically connected to each other by an anisotropic conductive adhesive layer.

15. A display device comprising:

a display panel comprising a display area in which pixels are disposed and a non-display area defined adjacent to the display area;

an electronic component disposed in the non-display area and electrically connected to the display panel; and a flexible circuit board disposed in the non-display area and electrically connected to the display panel, wherein the electronic component comprises:

a signal terminal; and an alignment mark, and the display panel comprises:

a first signal pad disposed in the non-display area and corresponding to the signal terminal;

a second signal pad disposed in the non-display area and corresponding to the flexible circuit board;

an alignment pad disposed in the non-display area and corresponding to the alignment mark; and a reference pad that is disposed in the non-display area and does not overlap the electronic component or the flexible circuit board in a plan view, wherein the reference pad and the alignment pad are spaced apart from one another in a first direction in a plan view and a center of the reference pad is aligned with a center of the alignment pad in a second direction in which the display area and the flexible circuit board are spaced apart from one another, the first direction being perpendicular to the second direction.

16. The display device of claim 15, wherein the electronic component comprises a driving circuit chip or a circuit board.

17. A electronic device comprising:

a housing;

a window module;

a display device;

the display device comprises:

a display panel comprising a display area through which an image is displayed and a non-display area defined adjacent to the display area;

a driving circuit chip disposed in the non-display area and electrically connected to the display panel; and a flexible circuit board disposed in the non-display area and electrically connected to the display panel, wherein the driving circuit chip comprises:

a signal bump; and an alignment bump, and the display panel comprises:

a pixel disposed in the display area;

a first signal pad disposed in the non-display area and corresponding to the signal bump;

a second signal pad disposed in the non-display area and corresponding to the flexible circuit board;

an alignment pad disposed in the non-display area and corresponding to the alignment bump;

a reference pad that is disposed in the non-display area and does not overlap the driving circuit chip or the flexible circuit board in a plan view; and a signal line disposed in the display area and the non-display area and electrically connecting the pixel and the signal pad, wherein the reference pad and the alignment pad are spaced apart from one another in a first direction in a plan view and a center of the reference pad is aligned with a center of the alignment pad in a second direction in which the display area and the flexible circuit board are spaced apart from one another, the first direction being perpendicular to the second direction.

* * * * *